(12) United States Patent
Yamashita et al.

(10) Patent No.: US 9,960,147 B2
(45) Date of Patent: May 1, 2018

(54) POWER MODULE

(71) Applicant: HITACHI AUTOMOTIVE SYSTEMS, LTD., Hitachinaka-shi, Ibaraki (JP)

(72) Inventors: Shiro Yamashita, Tokyo (JP); Yusuke Takagi, Hitachinaka (JP); Takahiro Shimura, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 0 days. days.

(21) Appl. No.: 15/541,861

(22) PCT Filed: Dec. 10, 2015

(86) PCT No.: PCT/JP2015/084685
§ 371 (c)(1),
(2) Date: Jul. 6, 2017

(87) PCT Pub. No.: WO2016/125390
PCT Pub. Date: Aug. 11, 2016

(65) Prior Publication Data
US 2018/0005986 A1    Jan. 4, 2018

(30) Foreign Application Priority Data

Feb. 6, 2015 (JP) ................................. 2015-022257

(51) Int. Cl.
*H01L 29/49* (2006.01)
*H01L 25/065* (2006.01)
*H01L 23/00* (2006.01)

(52) U.S. Cl.
CPC .......... *H01L 25/0655* (2013.01); *H01L 24/17* (2013.01); *H01L 2224/17132* (2013.01); *H01L 2924/3841* (2013.01)

(58) Field of Classification Search
CPC ................. H01L 25/0655; H01L 24/17; H01L 2224/171132
See application file for complete search history.

(56) References Cited

U.S. PATENT DOCUMENTS

2005/0167802 A1    8/2005   Hirano et al.
2011/0114353 A1    5/2011   Iizuka et al.
(Continued)

FOREIGN PATENT DOCUMENTS

JP    2002-176128 A    6/2002
JP    2005-244166 A    9/2005
(Continued)

OTHER PUBLICATIONS

International Search Report, PCT/JP2015/084685, dated Feb. 9, 2016, 1 pg.

*Primary Examiner* — Michael Shingleton
(74) *Attorney, Agent, or Firm* — Volpe and Koenig, P.C.

(57) ABSTRACT

A power module includes a base plate, first, second, and third semiconductor chips. At least one of a third edge or fourth edge of the first semiconductor chip is disposed adjacent to a side end of the base plate. Among a half of a distance from a first edge of the first semiconductor chip to one edge of the second semiconductor chip, a half of a distance from a second edge of the first semiconductor chip to one edge of the third semiconductor chip, and a distance from the third edge or fourth edge of the first semiconductor chip disposed adjacent to the side end of the base plate to the side end of the base plate, a length of a solder fillet formed on the edge of the first semiconductor chip at the shortest distance is formed in the shortest length.

14 Claims, 18 Drawing Sheets

(56) References Cited

U.S. PATENT DOCUMENTS

2016/0005676 A1* 1/2016 Orimoto ................ H01L 24/33
    257/714
2016/0343645 A1* 11/2016 Pan ..................... H01L 23/5384

FOREIGN PATENT DOCUMENTS

| JP | 2013-069825 A | 4/2013 |
| JP | 2014-078739 A | 5/2014 |

* cited by examiner

FIG. 5
(a)
(b)
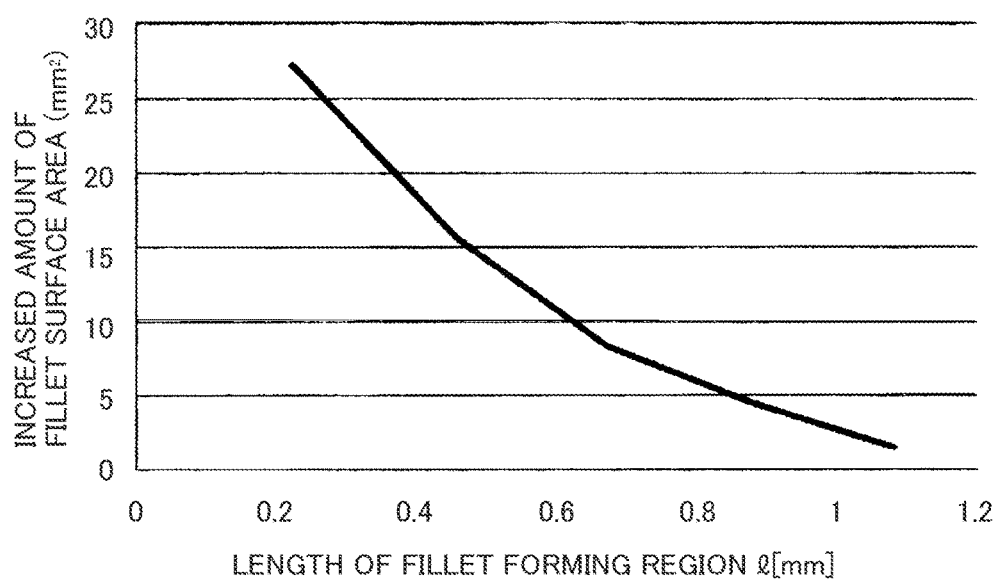

SECOND EMBODIMENT

SECOND EMBODIMENT

THIRD EMBODIMENT

FOURTH EMBODIMENT

FIFTH EMBODIMENT

SIXTH EMBODIMENT

FIRST EXEMPLARY MODIFICATION OF SIXTH EMBODIMENT

SECOND EXEMPLARY MODIFICATION OF SIXTH EMBODIMENT

SEVENTH EMBODIMENT

EXEMPLARY MODIFICATION OF SEVENTH EMBODIMENT

FIG. 17

FREQUENCY OF OCCURRENCES OF SHORT
CIRCUITS BETWEEN SEMICONDUCTOR CHIPS

|  | EXAMPLE 1 | COMPARATIVE EXAMPLE 1 |
|---|---|---|
| LENGTH OF FILLET ℓ | BETWEEN SEMICONDUCTOR CHIPS : 0.3 mm FRAME SIDE END : 1.0 mm | ALL 0.3 mm |
| NUMBER OF OCCURRENCES OF SHORT CIRCUITS | ZERO OUT OF 20 DEVICES | 7 OUT OF 20 DEVICES |
| OVERFLOWS OF SOLDER TO FRAME SIDE END | ZERO OUT OF 20 DEVICES | ZERO OUT OF 20 DEVICES |

FIG. 18

FREQUENCY OF OCCURRENCES OF
OVERFLOWS OF SOLDER TO FRAME SIDE END

|  | EXAMPLE 2 | COMPARATIVE EXAMPLE 2 |
|---|---|---|
| LENGTH OF FILLET $\ell$ | BETWEEN SEMICONDUCTOR CHIPS : 1.0 mm<br>FRAME SIDE END : 0.3 mm | ALL 0.3 mm |
| NUMBER OF OCCURRENCES OF SHORT CIRCUITS | ZERO OUT OF 20 DEVICES | ZERO OUT OF 20 DEVICES |
| OVERFLOWS OF SOLDER TO FRAME SIDE END | ZERO OUT OF 20 DEVICES | 11 OUT OF 20 DEVICES |

…

POWER MODULE

TECHNICAL FIELD

The present invention relates to a power module provided with a power semiconductor chip.

BACKGROUND ART

Vehicles, such as hybrid vehicles, plug-in hybrid vehicles, and electric vehicles, are mounted with a power-drive high-voltage rechargeable battery, an inverter that converts the power of the direct-current high-voltage output of the high-voltage rechargeable battery into the power of alternating current high voltage output for driving a motor, and other devices. The inverter includes a power module having a built-in power semiconductor chip.

As a power module, a structure is known in which a semiconductor chip is mounted between a pair of conductor plates thermally coupled to a heat dissipation plate. Moreover, a power module is known, which also uses a conductor plate as a heat dissipation plate. The semiconductor chip has one face and another face opposite to the one face. The one face and the another face of the semiconductor chip are respectively soldered to one or the other of a pair of conductor plates with the semiconductor chip sandwiched between the pair of conductor plates. In order to achieve high packaging density, a plurality of semiconductor chips is sometimes mounted between a pair of conductor plates. The area around the semiconductor chip is sometimes filled with a sealing resin (see e.g. Patent Literature 1).

CITATION LIST

Patent Literature

Patent Literature 1: Japanese Unexamined Patent Application Publication No. 2005-244166

SUMMARY OF INVENTION

Technical Problem

It is requested to achieve high packaging density and to further decrease distances between semiconductor chips mounted on a conductor plate or distances between the semiconductor chips and the outer edges of the conductor plate. However, conventionally, distances between semiconductor chips and distances between the semiconductor chips and the outer edges of a conductor plate have been all equal to each other. Thus, when even a part of the distances between semiconductor chips and the distances between the semiconductor chips and the outer edges of the conductor plate is shorter than a predetermined distance, this brings about a possibility that causes a short circuit between the semiconductor chips due to overflows of solder from the forming regions of solder fillets joining the semiconductor chip to the conductor plate or a possibility that causes overflows of solder from the forming regions of the solder fillets out of the outer edges of the conductor plate. When solder in the forming regions of the solder fillets overflows from the outer edges of the conductor plate, short circuits occur between other members, or the overflowed solder is peeled off to be a conductive foreign substance, resulting in a factor to cause a fault or a factor to degrade performances.

Solution to Problem

According to a first aspect of the present invention, a power module includes: a base plate; a first semiconductor chip having four edges; a second semiconductor chip having four edges, one of the four edges disposed adjacent to a first edge of the first semiconductor chip, the second semiconductor chip soldered to the base plate; and a third semiconductor chip having four edges, one of the four edges disposed adjacent to a second edge of the first semiconductor chip, the third semiconductor chip soldered to the base plate. In the power module, at least one of a third edge or a fourth edge of the first semiconductor chip is disposed adjacent to a side end of the base plate. Among a half of a distance from the first edge of the first semiconductor chip to the one edge of the second semiconductor chip, a half of a distance from the second edge of the first semiconductor chip to the one edge of the third semiconductor chip, and a distance from the third edge or the fourth edge of the first semiconductor chip disposed adjacent to the side end of the base plate to the side end of the base plate, a length of a solder fillet formed on the edge of the first semiconductor chip at the shortest distance is formed in the shortest length.

Advantageous Effects of Invention

According to the present invention, a short circuit between semiconductor chips or overflows of solder from the side end of a base plate due to overflows of solder from solder fillet forming regions can be suppressed.

BRIEF DESCRIPTION OF DRAWINGS

FIG. 5 show diagrams for explaining the relationship between the increased amount of the surface area of a solder fillet and the length of a solder fillet forming region; (a) is a cross sectional view for illustrating the criteria of the solder structure of a semiconductor chip, and (b) is a characteristic view of the relationship between the increased amount of the surface area of the solder fillet and the length of the solder fillet forming region.

FIG. 17 is a diagram of a first effect of the present invention showing the frequency of occurrence of short circuits between semiconductor chips according to the first embodiment of the present invention.

FIG. 18 is a diagram of a second effect of the present invention showing the frequency of occurrence of overflows of solder to the side end of a frame according to the second embodiment of the present invention.

DESCRIPTION OF EMBODIMENTS

First Embodiment
(Overall Structure of a Power Module)

In the following, referring to FIGS. 1 to 4, a first embodiment of a power module according to the present invention will be described.

Figure 1:
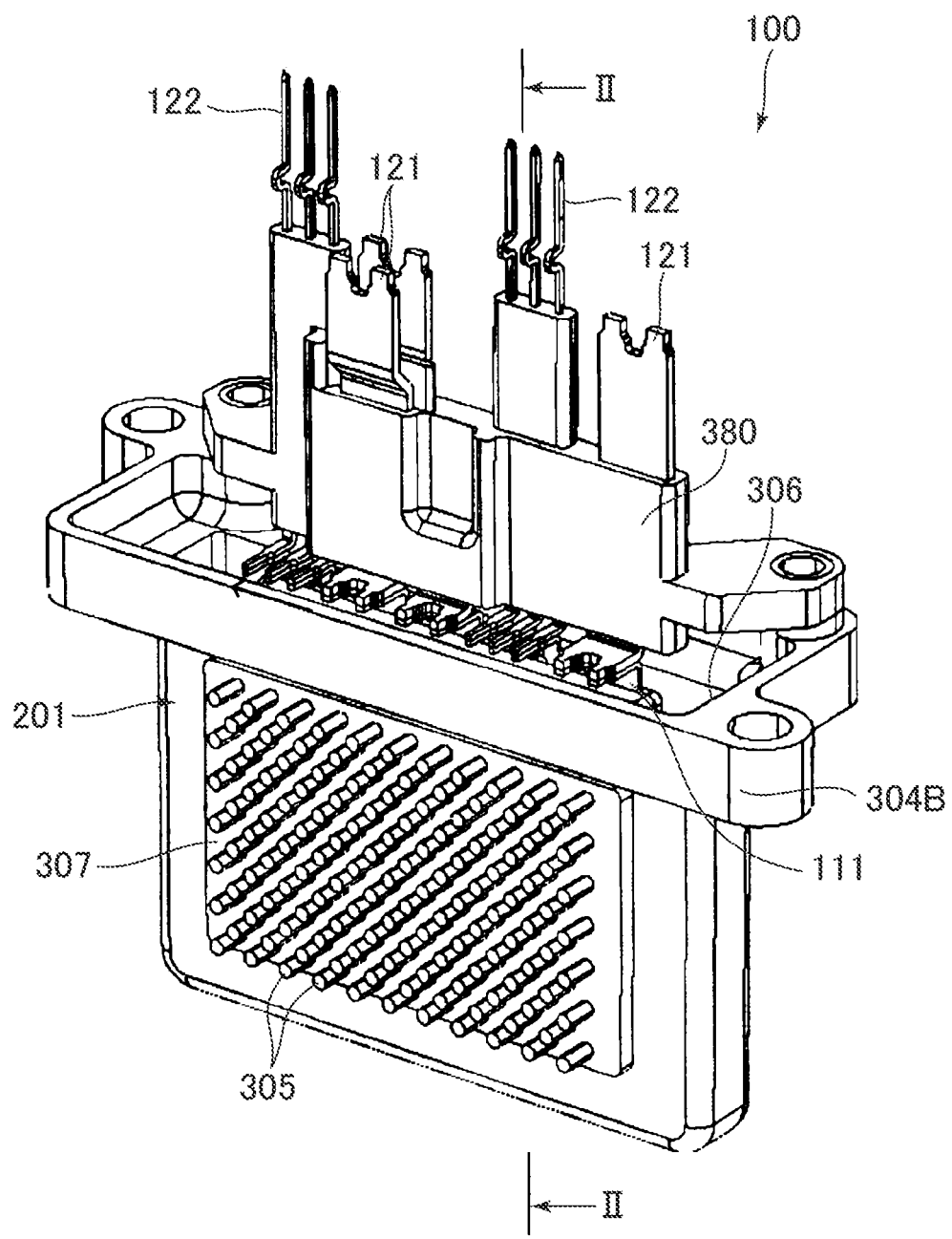
FIG. 1 is a perspective view of the appearance of an embodiment of a power module according to the present invention.
Figure 2:
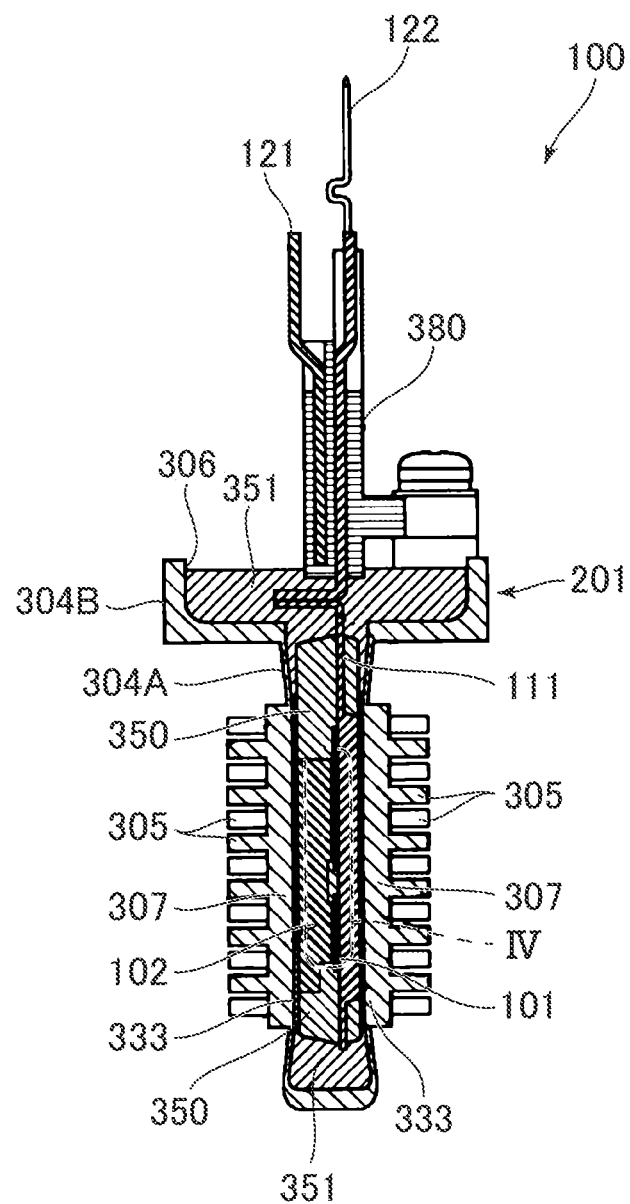
FIG. 2 is a cross sectional view of the power module in FIG. 1 taken along line II-II in FIG. 1.

FIG. 1 is a perspective view of the appearance of an embodiment of a power module according to the present invention. FIG. 2 is a cross sectional view of the power module in FIG. 1 taken along line II-II in FIG. 1.

For example, a power module 100 according to the embodiment of the present invention can be used in a device, such as an on-vehicle power converter of a rotary electric machine drive system installed on an automobile.

The power module 100 includes a module case 201, which accommodates a plurality of power semiconductor chips 11 to 14 to be described later, mounted between a first lead frame 101 and a second lead frame 102 (see FIG. 3 and other drawings).

The module case 201 is formed of an aluminum alloy material, such as Al, AlSi, AlSiC, and Al—C, for example, having a can-type shape formed in one piece with no seam (in the following, referred to as a can type). Here, the can type means a container in a nearly rectangular parallelepiped shape with a bottom, the container having an insertion port 306 on a predetermined one face. The module case 201 has a structure having no openings other than the insertion port 306. The outer edge of the insertion port 306 is surrounded by a flange 304B.

A metal case in such a shape is formed. Thus, even though the module case 201 is inserted into a passage in which a cooling medium, such as water and oil, flows, sealing against the cooling medium can be secured by the flange 304B. In other words, the cooling medium can be prevented from entering the inside and the terminal portion of the module case 201 with a simple configuration.

The shape of the module case 201 below the flange 304B has a thin rectangular parallelepiped shape having a pair of heat dissipation bases 307 on which fins 305 are uniformly disposed. At the connecting parts of the heat dissipation bases 307 to the flange 304B, a curved portion 304A is formed whose thickness is extremely thin. An insulating sheet 333 of a high thermal conductivity is provided between the inner surfaces of the heat dissipation bases 307 and the first and the second lead frames 101 and 102. In operation, the power semiconductor chips 11 to 14 generate heat, and their temperatures become high. In the power module 100 according to the embodiment, heat generated by the semiconductor chips 11 to 14 in operation is spread in the first and the second lead frames 101 and 102, and conducted to the insulating sheet 333. The heat is dissipated from the heat dissipation bases 307 formed on the module case 201 and the fins 305 provided on the heat dissipation bases 307 to a cooling medium. Thus, a high cooling performance can be implemented.

The semiconductor chips 11 to 14 are mounted between the first and the second lead frames 101 and 102 by soldering, and regions around the semiconductor chips 11 to 14 are sealed with a primary sealing material 350. The mounting structure of the semiconductor chips 11 to 14 on the first and the second lead frames 101 and 102 will be described later.

The first lead frame 101 has a plurality of leads 111 extending upwardly. The tip ends of the leads 111 are exposed to the outside of the primary sealing material 350. In other words, the first lead frame 101 is integrally formed with the primary sealing material 350 with the tip ends of the leads 111 exposed. To the tip ends of the leads 111, direct current positive and negative electrode terminals 121 and an alternating current terminal 121 and a plurality of external signal terminals 122 are joined by soldering, for example. The direct current positive and negative electrode terminals 121 and the alternating current terminal 121, the plurality of external signal terminals 122, and the leads 111 of the first lead frame 101 are integrally formed with an auxiliary mold body 380.

The primary sealing material 350 integrally formed with the first lead frame 101 is accommodated in the module case 201 with the direct current positive and negative electrode terminals 121 and the alternating current terminal 121 and the plurality of external signal terminals 122, which are integrally formed with the auxiliary mold body 380, connected to the corresponding leads 111 of the first lead frame 101. In this state, a secondary sealing material 351 is charged from the insertion port 306 of the flange 304B. The secondary sealing material 351 is charged in the inner side of the flange 304B and the space between the edges of the first and the second lead frames 101 and 102 and the primary sealing material 350. The secondary sealing material 351 is also charged between the bottom face of the module case 201 and the lower face of the primary sealing material 350. The power module 100 has such a structure. The power module 100 converts the power of the direct-current high-voltage output of a high-voltage rechargeable battery into the power of an alternating current high voltage output to function as an inverter for driving a motor, for example.

(Mounting Structure of the Semiconductor Chips)

Figure 3:
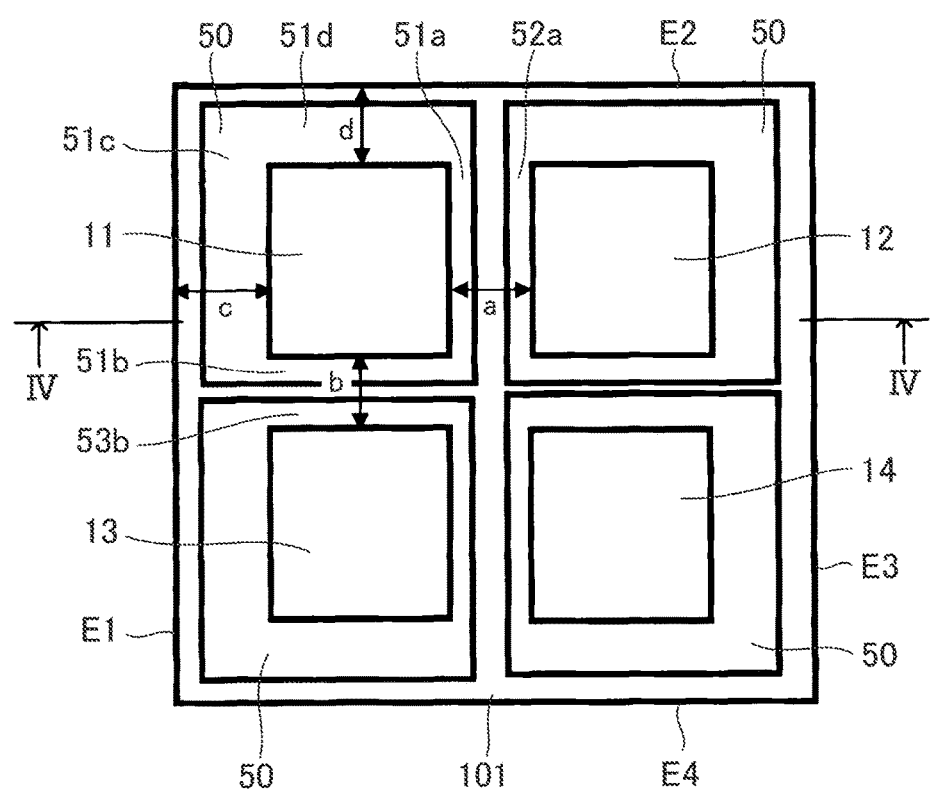
FIG. 3 is a schematic plan view of the mounting structure of semiconductor chips.
Figure 4:
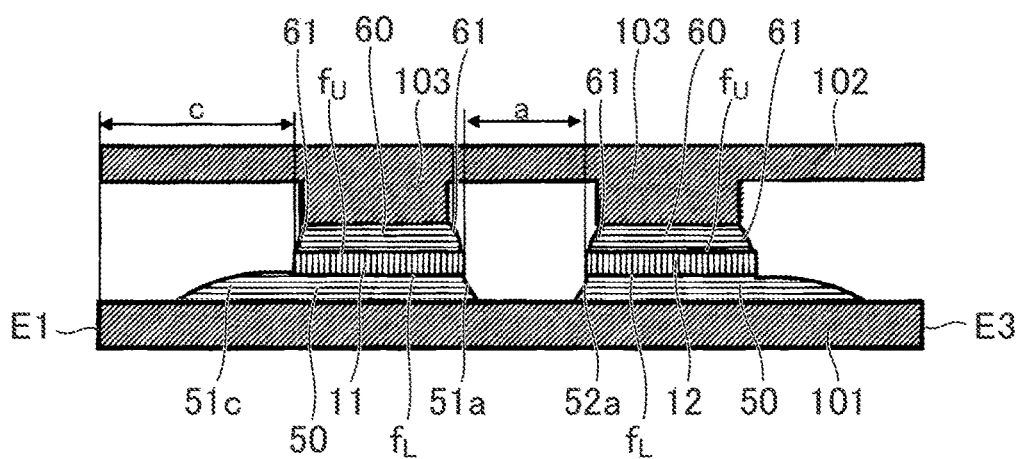
FIG. 4 is an enlarged cross sectional view of region IV in FIG. 2 taken along line IV-IV in FIG. 3.

FIG. 3 is a schematic plan view of the mounting structure of the semiconductor chips. FIG. 4 is an enlarged cross sectional view of region IV in FIG. 2 taken along line IV-IV in FIG. 3. Note that, in FIG. 3, the semiconductor chips are illustrated with the second lead frame 102 removed. In FIG. 4, the components, such as the leads 111, disposed on the outer side of region IV in FIG. 2 are omitted.

The first base plate, i.e., the first lead frame 101, and the second base plate, i.e., the second lead frame 102 are formed by punching a metal plate. For the metal plate, materials, such as copper, aluminum, and iron, can be used. The first and the second lead frames 101 and 102 preferably have high coefficients of thermal conductivity. Thus, specifically, copper and aluminum materials are preferable, which have excellent coefficients of thermal conductivity.

The first and the second lead frames 101 and 102 are oppositely disposed with space from each other. Four semiconductor chips 11 to 14 are disposed between the first and the second lead frames 101 and 102. As illustrated in FIG. 4, on the second lead frame 102, four projections 103 are formed opposite to the respective semiconductor chips 11 to 14. The four projections 103 are disposed in a two-by-two matrix configuration.

The semiconductor chips 11 to 14 are in a thin rectangular parallelepiped shape, and configured of insulated-gate bipolar transistors (IGBT), for example. The semiconductor chips 11 to 14 may include diodes and passive devices together with IGBTs. The semiconductor chips 11 to 14 include one face $f_L$, which is a lower face in FIG. 4, and another face $f_U$, which is a top face in FIG. 4. On the another face $f_U$ of each of the semiconductor chips 11 to 14, the collector electrode of the IGBT is formed, for example. On the one face $f_L$ of each of the semiconductor chips 11 to 14, the emitter electrode of the IGBT and a plurality of control electrodes are formed. The control electrodes, not shown in FIG. 4, are connected to the lead 111 by bonding wires.

The one face $f_L$ of each of the semiconductor chips 11 to 14 is soldered with a first solder 50 on the first lead frame 101. The another face $f_U$ of each of the semiconductor chips 11 to 14 is soldered to the projection 103 of the second lead frame 102 with a second solder 60. The projection 103 is formed in a rectangular shape slightly smaller than the sizes of the semiconductor chips 11 to 14 in a planar view. The structure is provided in which the another face $f_U$ is soldered to the projection 103 of the second lead frame 102. Thus, similarly to the projections 103, the semiconductor chips 11 to 14 are disposed in a two-by-two matrix configuration.

For the solder materials of the first and the second solders 50 and 60, in addition to Sn-rich materials, Au, Zn—Al, and Al materials can be used. In addition to the solder materials, materials containing a resin, such as Ag paste, Cu paste, sintered Ag, and sintered Cu, can also be used. Materials containing a resin preferably have low viscosity.

The mounting structure of the semiconductor chips illustrated in FIGS. 3 and 4 is formed by procedures below, for example.

A solder material, which is to be hardened as the first solder 50, is supplied to the first lead frame 101. For this solder, a sheet solder can be used. Alternatively, methods can also be used, in which a solder paste is formed by printing, and in which a molten solder is supplied. On the solder material, which is to be hardened as the first solder 50, the semiconductor chips 11 to 14 are placed. On the semiconductor chips 11 to 14, a solder material, which is to be hardened as the second solder 60, is supplied. The supply of this solder material can be similarly performed as the supply of the solder material, which is to be hardened as the first solder 50. The projections 103 are aligned with the solder material, which is to be hardened as the second solder 60, and then the second lead frame 102 is placed on the solder material, which is to be hardened as the second solder 60. The first and the second lead frames 101 and 102 are heated with the second lead frame 2 pressed against the first lead frame 101 for soldering the semiconductor chips 11 to 14 to the first and the second lead frames 101 and 102. Thus, the mounting structure of the semiconductor chips 11 to 14 illustrated in FIGS. 3 and 4 is prepared.

Next, the mounting structure of the semiconductor chips 11 to 14 will be described in more detail.
(Solder Structure of the Semiconductor Chips to the First Lead Frame)

As illustrated in FIGS. 3 and 4, the semiconductor chips 11 to 14 are not disposed in the center part of the first solder 50. The semiconductor chips 11 to 14 are disposed at positions close to the adjacent other semiconductor chips 11 to 14, not in the center part.

Distances a to d in FIG. 3 are defined as below. Note that, four edges of the first lead frame, i.e., side ends E1 to E4 are as illustrated in FIG. 3.

A distance between the semiconductor chip 11 and the semiconductor chip 12, i.e., a distance between the edges of the semiconductor chip 11 and the semiconductor chip 12 opposite to each other is defined as a;

A distance between the semiconductor chip 11 and the semiconductor chip 13, i.e., a distance between the edges of the semiconductor chip 11 and the semiconductor chip 13 opposite to each other is defined as b;

A distance between the left edge of the semiconductor chip 11 and the left side end E1 of the first lead frame 101 is defined as c; and A distance between the upper edge of the semiconductor chip 11 and the upper side end E2 of the first lead frame 10 is defined as d.

Between the semiconductor chip 11 and the semiconductor chip 12, a solder fillet 51a of the semiconductor chip 11 and a solder fillet 52a of the semiconductor chip 12 are formed. Between the semiconductor chip 11 and the semiconductor chip 13, a solder fillet 51b of the first semiconductor chip 11 and a solder fillet 53b of the semiconductor chip 13 are formed.

It is assumed that the length of the solder fillet 51a is equal to the length of the solder fillet 52a, and the length of the solder fillet 51b is equal to the length of the solder fillet 53b. In this case, the lengths of the solder fillets 51a and 52a have to be a/2 or less, and the lengths of the solder fillets 51b and 53b have to be b/2 or less. Note that, in the present specification, as illustrated in FIG. 5(a), the length of the solder fillet is defined as a length l from the edge of the semiconductor chip to the tip end of the solder fillet.

The semiconductor chips 11 to 14 are disposed at the positions close to the adjacent other semiconductor chips 11 to 14, not in the center parts of four chip mounting regions almost equally divided on the first lead frame 101. Here, the centers of four projections 103 of the second lead frame 102 are matched with the centers of the semiconductor chips 11 to 14, which are not mounted in the centers of the chip mounting regions. The distances a/2 and b/2 are shorter than the distances c and d. The shorter the distance between the semiconductor chips is, or the shorter the distance between the semiconductor chip and the side end of the base plate, the greater the possibility is that the semiconductor chips are short-circuited due to the overflow of the solder fillet or that the solder fillet overflows from the side end of the base plate.

Therefore, in the semiconductor chips 11 and 12, the lengths of the solder fillets 51a and 52a formed on the edges adjacent to the other semiconductor chips 11 and 12 are formed shorter than the lengths of the solder fillets 51c and 51d formed on two edges of the semiconductor chip 11 adjacent to the side ends E1 and E2 of the first lead frame 101. In other words, the lengths of the solder fillets 51c and 51d are formed longer than the lengths of the solder fillets 51a and 52a. Thus, a short circuit between the semiconductor chips 11 and 12 due to overflows of solder from the forming regions of the solder fillets 51a and 52a can be suppressed.

Similarly, in the semiconductor chips 11 and 13, the lengths of the solder fillets 51b and 53b formed on the edges adjacent to the other semiconductor chips 11 and 13 are formed shorter than the lengths of the solder fillets 51c and 51d formed on two edges of the semiconductor chip 11 adjacent to the side ends E1 and E2 of the first lead frame 101. In other words, the lengths of the solder fillets 51c and 51d are formed longer than the lengths of the solder fillets 51*b* and 53*b*. Thus, a short circuit between the semiconductor chips 11 and 13 due to overflows of solder from the forming regions of the solder fillets 51*b* and 53*b* can be suppressed.

In comparison of the distance a with the distance b, the length of the solder fillet formed on the edge at a shorter distance is made shorter. For example, in the case where the distance a is shorter than the distance b, the length of the solder fillet 51*a* is formed shorter than the length of the solder fillet 51*b*.

In comparison of the distance c with the distance d, the length of the solder fillet formed on the edge at a shorter distance may be formed shorter. For example, in the case where the distance c is shorter than the distance d, the length of the solder fillet 51*c* may be formed shorter than the length of the solder fillet 51*d*.

In the embodiment, the reason why the lengths of the solder fillets 51*a*, 51*b*, 52*a*, and 53*b* can be made shorter will be described.

Since surface tension force acts on the surface of a liquid, the surface tension force acts so as to decrease the surface area, i.e., so as to decrease surface energy. Thus, in the case of increasing the surface area, energy to increase the surface area against surface tension force is necessary. The greater the increased amount of the surface area of solder is, the greater energy necessary for this increase is.

Overflows of solder in forming solder fillets are caused by increasing a pressure in solder to cause a swell of the solder in the solder fillet forming region due to a short length of the solder fillet forming region with respect to a predetermined solder volume. In the case where volumes of solder to form solder fillets are equal, the increased amount of the surface area of the solder is changed depending on the lengths of the solder fillets.

FIG. 5 show an example of the correlation between the length l of the solder fillet and the increased amount of the surface area of solder. FIG. 5(*a*) is a cross sectional view for illustrating the criteria of the solder structure of a semiconductor chip. FIG. 5(*b*) is a characteristic view of the relationship between the increased amount of the surface area of the solder fillet and the length of the solder fillet forming region.

In the solder structure of the semiconductor chip to the base plate shown in FIG. 5(*a*), the size of the chip is a 10-mm square. A thickness t of the solder is 0.2 mm.

The increased amount of the surface area of the solder fillet in FIG. 5(*b*) is the increased amount of the surface area of the solder fillet, which is derived in the case where the semiconductor chip is sunk from the surface of the solder by 0.05 mm. The surface area of the solder is assumed that the solder fillet swells in an arc shape.

FIG. 5(*b*) reveals that the longer the length l of the solder fillet forming region is, the smaller the increased amount of the surface area of the solder is. In other words, the shorter the length l of the solder fillet forming region is, the greater the increased amount of the surface area of the solder of the solder fillet is. As described above, the greater the increased amount of the surface area of the solder is, the greater energy necessary for the increase is. With the use of this phenomenon, energy applied to the solder material with the first solder 50 being molten in pressing the semiconductor chip 11 against the first lead frame 101 is consumed by increasing the surface areas of the solder fillets 51*c* and 51*d* having a long length l of the solder fillet forming region. Thus, an increase in the surface areas of the solder fillets 51*a* and 51*b* having a short length l of the solder fillet forming region, i.e., overflows of solder from the solder fillet forming regions can be suppressed.

Referring to FIG. 4, the semiconductor chips 11 to 14 and the projections 103 are disposed on the same center parts. In other words, the gaps between four edges of each of the semiconductor chips 11 to 14 and four edges of the projection 103 are almost equal. Thus, the second solder 60 joining the semiconductor chips 11 to 14 to the projections 103 has a solder fillet 61, which is formed on four edges of each of the semiconductor chips 11 to 14 in equal length.

The length of the solder fillet 61 can be formed shorter than the lengths of the solder fillets 51*a* and 51*b*. The reason is as below.

As described above, the semiconductor chips 11 to 14 are heated, pressed, and soldered, with the first lead frame 101, the first solder, the semiconductor chips 11 to 14, the second solder 60, and the second lead frame 102 stacked. In other words, in soldering, both of the first and the second solders 50 and 60 are molten. In this state, the first and the second solders 50 and 60 are formed separately from each other. However, the relationship between the increased amount of the surface area of the solder fillet and the length of the solder fillet forming region has the relationship shown in FIG. 5(*b*). Thus, energy applied to the solder material with the first and the second solders 50 and 60 being molten is consumed by increasing the surface areas of the solder fillets 51*c* and 51*d* having a long length l of the solder fillet forming region and the surface areas of the solder fillets 51*a* and 51*b*. Consequently, an increase in the surface area of the solder fillet 61 having a short length l of the solder fillet forming region, i.e., overflows of solder from the solder fillet forming regions can be suppressed.

Note that, the length of the solder fillet 61 is not necessarily shorter than the lengths of the solder fillets 51*a* and 51*b*.

Note that, in the description above, the semiconductor chip 11 was described. The semiconductor chips 12 to 14 are the same as the case of the semiconductor chip 11. In other words, also in the semiconductor chips 12 to 14, the lengths of the solder fillets formed on the edges adjacent to the other semiconductor chips 11 to 14 are formed shorter than the lengths of the solder fillets formed on the edges adjacent to the side ends E1 to E4 of the first lead frame 101.

According to the embodiment, effects below are exerted.
(1) The semiconductor chips 11 to 14 were soldered to the first lead frame 101 with the first solder 50. In the semiconductor chips 11 to 14, the lengths of the solder fillets formed on the edges adjacent to the side ends E1 to E4 of the first lead frame 101 were formed longer than the lengths of the solder fillets formed on the edges adjacent to the other semiconductor chips 11 to 14.

Consequently, in the semiconductor chips 11 to 14, overflows of solder from the forming regions of the solder fillets formed on the edges adjacent to the other semiconductor chips 11 to 14 can be suppressed, and a short circuit between the semiconductor chips 11 to 14 can be prevented.

Second Embodiment

Figure 6:
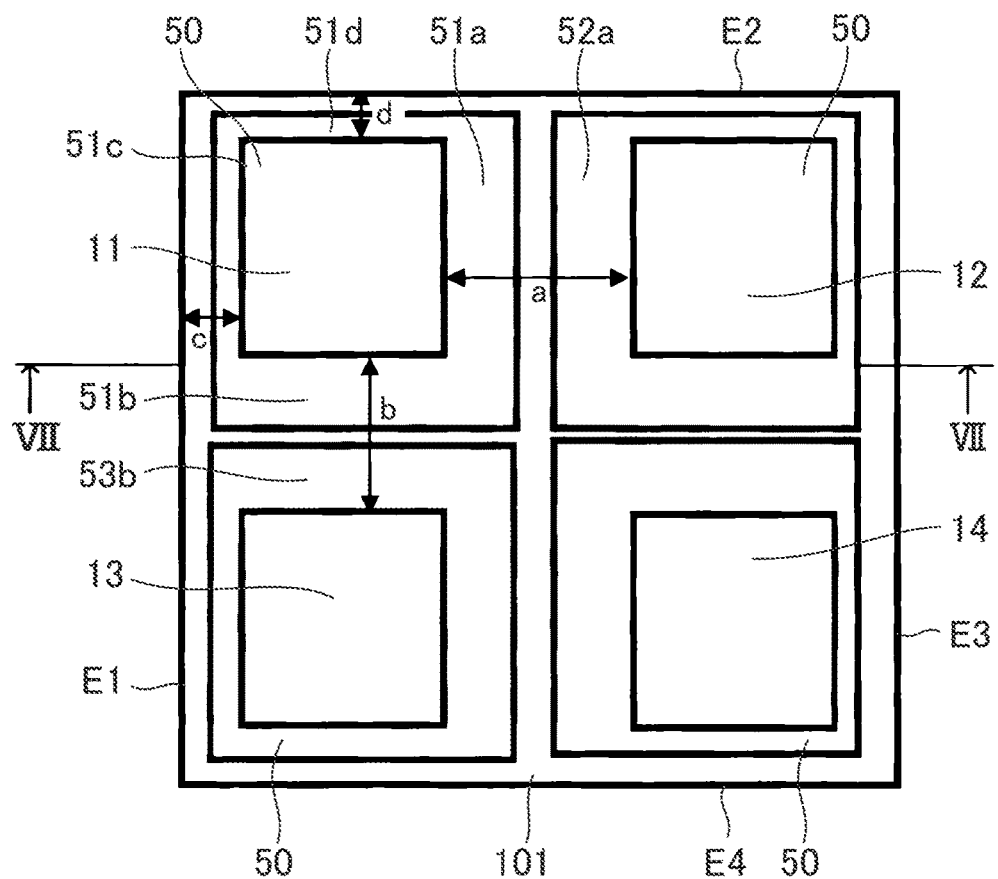
FIG. 6 is a schematic plan view of a second embodiment of the present invention showing the mounting structure of semiconductor chips provided on a power module.
Figure 7:
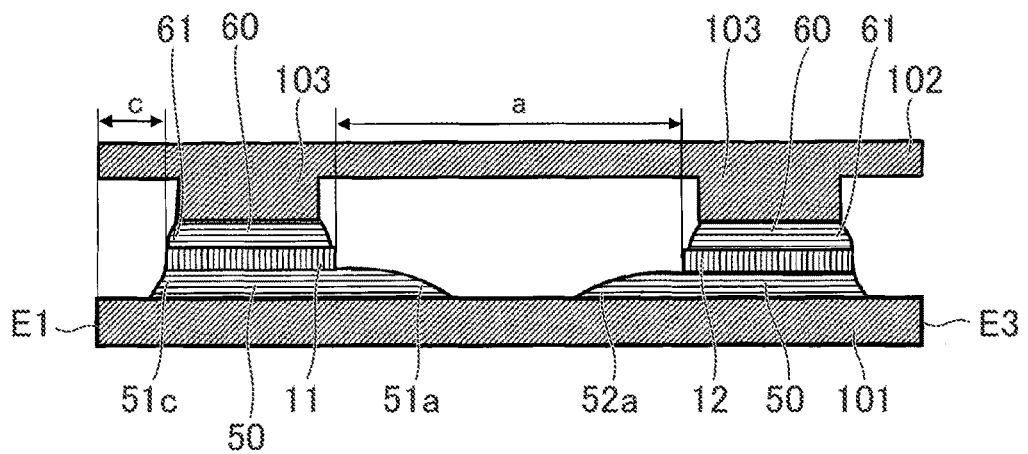
FIG. 7 is a cross sectional view taken along line VII-VII in FIG. 6.

FIG. 6 is a schematic plan view of a second embodiment of the present invention showing the mounting structure of semiconductor chips provided on a power module. FIG. 7 is a cross sectional view taken along line VII-VII in FIG. 6.

In the second embodiment, first and second lead frames 101 and 102, semiconductor chips 11 to 14, first and second solders 50 and 60 are members the same as the members of the first embodiment. The second embodiment is different from the first embodiment is in that the semiconductor chips 11 to 14 are disposed at positions near the corners of the first lead frame 101, not disposed in the center part of the first solder 50.

In other words, supposing that the definitions of distances a, b, c, and d in the second embodiment are the same as those in the first embodiment, the following configuration is provided.

The semiconductor chip 11 is taken up as an example for description. The lengths of solder fillets 51c and 51d formed on two edges adjacent to side ends E1 and E2 of the first lead frame 101 are formed shorter than the length of a solder fillet 51a formed on the edge of the semiconductor chip 11 adjacent to the semiconductor chip 12 and the length of a solder fillet 52a formed on the edge of the semiconductor chip 12 adjacent to the semiconductor chip 11. In other words, the lengths of the solder fillets 51a and 52a formed on the semiconductor chips 11 and 12 are formed longer than the lengths of the solder fillets 51c and 51d formed on two edges of the semiconductor chip 11. Thus, overflows of solder from the forming regions of the solder fillets 51c and 51d to the side ends E1 and E2 of the first lead frame 101 are suppressed.

Similarly, the lengths of the solder fillets 51c and 51d formed on two edges of the semiconductor chip 11 adjacent to the side ends E1 and E2 of the first lead frame 101 are formed shorter than a solder fillet 51b formed on the edge of the semiconductor chip 11 adjacent to the semiconductor chip 13 and the length of a solder fillet 53b formed on the edge of the semiconductor chip 13 adjacent to the semiconductor chip 11. In other words, the lengths of the solder fillets 51b and 53b formed on the semiconductor chips 11 and 13 are formed longer than the lengths of the solder fillets 51c and 51d formed on two edges of the semiconductor chip 11. Thus, overflows of solder from the forming regions of the solder fillets 51c and 51d to the side ends E1 and E2 of the first lead frame 101 are suppressed.

In comparison of the distance c with the distance d, the length of the solder fillet formed on the edge at a shorter distance is made shorter. For example, in the case where the distance c is shorter than the distance d, the length of the solder fillet 51c is formed shorter than the length of the solder fillet 51d.

In comparison of the distance a with the distance b, the length of the solder fillet formed on the edge at a shorter distance may be made shorter. For example, in the case where the distance a is shorter than the distance b, the length of the solder fillet 51a is formed shorter than the length of the solder fillet 51b.

Note that, also in the semiconductor chips 12 to 14, the relationship of a half of the distance a and a half of the distance b between the edges adjacent to the other semiconductor chips 12 to 14 to the distances c and d from the edges of the semiconductor chips 12 to 14 to the side ends E1 to E4 of the first lead frame 101 are similar to the case of the semiconductor chip 11. The lengths of the solder fillets formed on the edges of the semiconductor chips 12 to 14 are similar to the solder fillets formed on the edges of the semiconductor chip 11. In other words, also in the semiconductor chips 12 to 14, the lengths of the solder fillets formed on the edges adjacent to the side ends E1 to E4 of the first lead frame 101 are formed shorter than the lengths of the solder fillets formed on the edges adjacent to the other semiconductor chips 11 to 14.

According to the second embodiment, an effect below is exerted. (1) The semiconductor chips 11 to 14 were soldered to the first lead frame 101 with the first solder 50. In the semiconductor chips 11 to 14, the lengths of the solder fillets formed on the edges adjacent to the other semiconductor chips 11 to 14 were formed longer than the lengths of the solder fillets formed on the edges adjacent to the side ends of the first lead frame 101.

Consequently, overflows of solder from the forming regions of the solder fillets formed on the edges of the semiconductor chips 11 to 14 adjacent to the side ends of the first lead frame 101 to the side ends of the first lead frame 101 can be suppressed.

Third Embodiment

Figure 8:
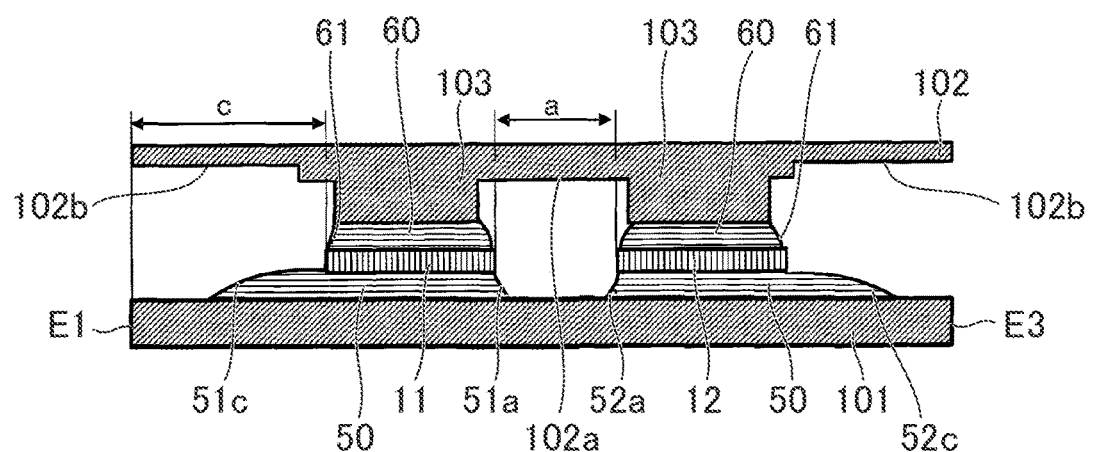
FIG. 8 is a cross sectional view of a third embodiment of the present invention showing the mounting structure of semiconductor chips provided on a power module.

FIG. 8 is a cross sectional view of a third embodiment of the present invention showing the mounting structure of semiconductor chips provided on a power module. FIG. 8 is a diagram of a region corresponding to FIG. 4 of the first embodiment of the power module.

A power module 100 according to the third embodiment is different from the first embodiment in that a recess 102b is formed on an inner surface 102a of a second lead frame 102 opposite to a first lead frame 101. The other configurations of the power module 100 according to the third embodiment are similar to those of the first embodiment.

As described in the first embodiment, solder fillets 51c and 51d are formed on the edges adjacent to side ends E1 and E2 of the first lead frame 101. The lengths of the solder fillets 51c and 51d are formed longer than the lengths of solder fillets 51a and 52a formed on the edges adjacent to the other semiconductor chips 11 and 12. Thus, solder easily overflows from the forming regions of the solder fillets 51c and 51d.

In the third embodiment, the recess 102b is formed on the inner surface 102a of the second lead frame 102 at a portion where the solder fillets 51c and 52c are opposite to each other. In FIG. 8, the side ends E1 and E3 of the second lead frame 102 are described. However, the recess 102b is similarly formed on side ends E2 and E4. As described above, when the length of the solder fillet forming region is long, solder easily overflows. Thus, solder overflows from the forming regions of the solder fillets 51c, 52c, 51d, and 52d having a long length of the solder fillet forming region, and contacts the second lead frame 102, sometimes causing a short circuit between the first and the second lead frames 101 and 102. In the third embodiment, the recess 102b is formed on the second lead frame 102 corresponding to portions where solder easily overflows. Consequently, a short circuit between the first and the second lead frames 101 and 102 can be prevented.

The other structures of the third embodiment are the same as the structures of the first embodiment. Thus, effects the same as the effect (1) of the first embodiment are exerted.

As described above, in the third embodiment, in the solder fillets formed on the edges of the semiconductor chips 11 to 14, the recess 102b is formed on the second lead frame 102 at portions opposite to the solder fillets formed on the edges adjacent to the first lead frame 101, i.e., long solder fillets. Consequently, even in the case where solder overflows from the forming regions of the long solder fillets, a short circuit between the first and the second lead frames 101 and 102 can be prevented.

Fourth Embodiment

Figure 9:
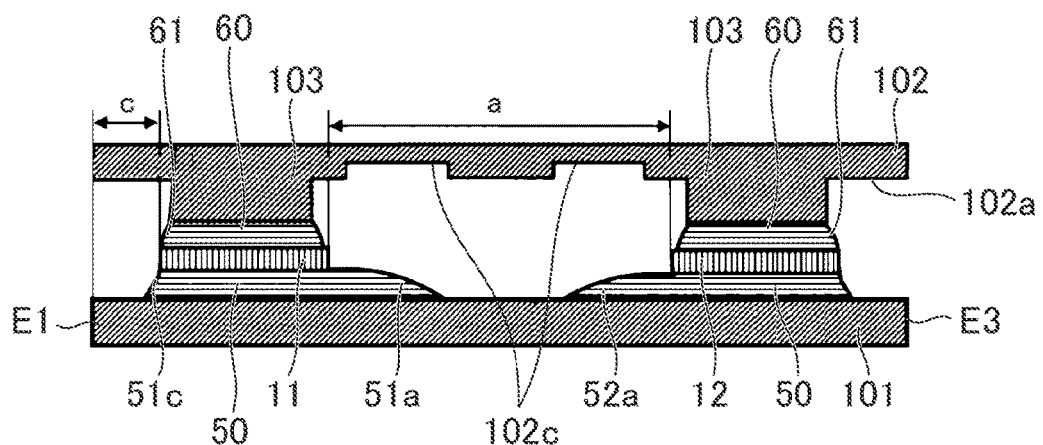
FIG. 9 is a cross sectional view of a fourth embodiment of the present invention showing the mounting structure of semiconductor chips provided on a power module.

FIG. 9 is a cross sectional view of a fourth embodiment of the present invention showing the mounting structure of semiconductor chips provided on a power module. FIG. 9 is a diagram of a region corresponding to FIG. 7 of the second embodiment of the power module.

A power module 100 according to the fourth embodiment is different from the second embodiment in that a recess 102c is formed on an inner surface 102a of a second lead frame 102 opposite to a first lead frame 101. The other configurations of the power module 100 according to the fourth embodiment are similar to those of the second embodiment.

As described in the second embodiment, solder fillets 51a and 52a are formed on the edges of semiconductor chips 11 and 12 adjacent to the edges of the other semiconductor chips 11 and 12. The lengths of the solder fillets 51a and 52a are formed longer than the lengths of solder fillets 51c and 51d of the semiconductor chip 11 formed on the edges adjacent to side ends E1 and E2 of the first lead frame 101. Thus, solder easily overflows from the forming regions of the solder fillets 51a and 52a.

In the fourth embodiment, the recess 102c is formed on the inner surface 102a of the second lead frame 102 at portions opposite to the solder fillets 51a and 52a. In FIG. 9, the solder fillets 51a and 52a between the semiconductor chips 11 and 12 are described. The recess 102c is formed on the portions opposite to the solder fillets between the semiconductor chips 11 and 13, the solder fillets between the semiconductor chips 12 and 14, and the solder fillets between the semiconductor chips 13 and 14. Consequently, a short circuit between the first and the second lead frames 101 and 102 can be prevented, which is due to overflows of solder from the forming regions of the solder fillets 51a and 52a to cause the solder to contact the second lead frame 102.

The other structures of the fourth embodiment are the same as the structures of the second embodiment. Thus, an effect the same as the effect (1) of the second embodiment is exerted.

As described above, in the fourth embodiment, in the solder fillets formed on the edges of the semiconductor chips 11 to 14, the recess 102c is formed on the second lead frame 102 opposite to the solder fillets formed on the edge adjacent to the edge of the other semiconductor chips 11 to 14, i.e., long solder fillets.

Consequently, even in the case where a long solder fillet overflows, a short circuit between the first and the second lead frames 101 and 102 can be prevented.

Fifth Embodiment

Figure 10:
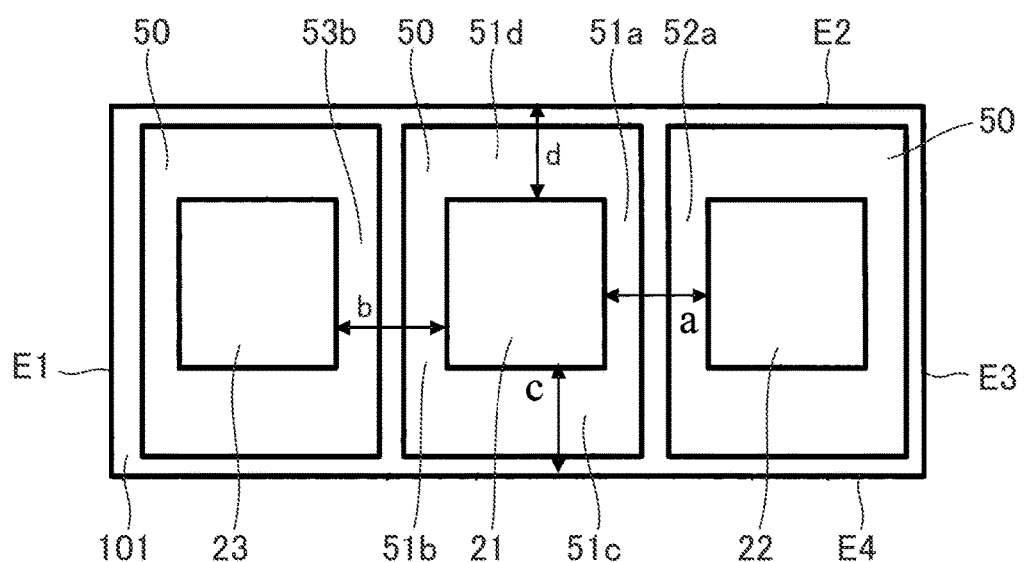
FIG. 10 is a schematic plan view of a fifth embodiment of the present invention showing the mounting structure of semiconductor chips provided on a power module.

FIG. 10 is a schematic plan view of a fifth embodiment of the present invention showing the mounting structure of semiconductor chips provided on a power module.

A power module 100 according to the fifth embodiment includes three semiconductor chips 21 to 23 linearly arrayed. First solders 50 fixing the semiconductor chips 21 to 23 are in a rectangular shape in a planar view, in which the length in the arraying direction, i.e., the length in the lateral direction is longer than the length in a direction orthogonal to the arraying direction, i.e., the length in the vertical direction. The semiconductor chips 21 to 23 are in a square in a planar view. The semiconductor chips 21 to 23 are disposed almost in the center part of the first solder 50 in the lateral direction and in the vertical direction.

Distances a to d in FIG. 10 are defined as below.

A distance from the edge of the semiconductor chip 21 adjacent to the semiconductor chip 22 to the edge of the semiconductor chip 22 adjacent to the semiconductor chip 21 is defined as a;

A distance from the edge of the semiconductor chip 21 adjacent to the conductor the chip 23 to the edge of the semiconductor chip 23 adjacent to the semiconductor chip 21 is defined as b;

A distance from the edge of the semiconductor chip 21 adjacent to a lower side end E4 of a first lead frame 101 to the lower side end E4 of the first lead frame 101 is defined as c; and A distance from the edge of the semiconductor chip 21 adjacent to an upper side end E2 of the first lead frame 101 to the upper side end E2 of the first lead frame 101 is defined as d.

In the fifth embodiment, distances a/2 and b/2 are shorter than the distances c and d.

The lengths of solder fillets 51a and 52a of the semiconductor chips 21 and 22 formed on the edges adjacent to the other semiconductor chips 21 and 22 are formed shorter than the lengths of solder fillets 51c and 51d formed on the edges of the semiconductor chip 21 adjacent to the side ends E2 and E4 of the first lead frame 101. In other words, the lengths of the solder fillets 51c and 51d formed on the semiconductor chip 21 are formed longer than the lengths of the solder fillets 51a and 52a formed on the semiconductor chips 21 and 22. Thus, a short circuit between the semiconductor chips 21 and 22 due to overflows of solder from the forming regions of the solder fillets 51a and 52a can be suppressed.

Similarly, the lengths of solder fillets 51b and 53b of the semiconductor chips 21 and 23 formed on the edges adjacent to the other semiconductor chips 21 and 23 are formed shorter than the lengths of the solder fillets 51c and 51d formed on the edges of the semiconductor chip 21 adjacent to the side ends E2 and E4 of the first lead frame 101. In other words, the lengths of the solder fillets 51c and 51d formed on the semiconductor chip 21 are formed longer than the lengths of the solder fillets 51b and 53b formed on the semiconductor chips 21 and 23. Thus, a short circuit between the semiconductor chips 21 and 23 due to overflows of solder from the forming regions of the solder fillets 51b and 53b can be suppressed.

In comparison of the distance a with the distance b, the length of the solder fillet formed on the edge at a shorter distance is made shorter. For example, in the case where the distance a is shorter than the distance b, the length of the solder fillet 51a is made shorter than the length of the solder fillet 51b.

In comparison of the distance c with the distance d, the length of the solder fillet formed on the edge at a shorter distance may be made shorter. For example, in the case where the distance c is shorter than the distance d, the length of the solder fillet 51c may be made shorter than the length of the solder fillet 51d.

In the fifth embodiment, the lengths of the solder fillets 51c and 51d formed on the edges of the semiconductor chip 21 adjacent to the side ends E2 and E4 of the first lead frame 101 were formed longer than the lengths of the solder fillets 51a and 51b formed on the edges of the semiconductor chip 21 adjacent to the semiconductor chips 22 and 23.

Thus, similarly to the effect (1) of the first embodiment, overflows of solder from the forming regions of the solder fillets 51a and 51b formed on the edges of the semiconductor chip 21 adjacent to the semiconductor chips 22 and 23 can be suppressed, and a short circuit between the semiconductor chips 21 to 23 can be prevented.

Note that, similarly to the third embodiment (see FIG. 8), in the fifth embodiment, a recess 102b maybe formed on an inner surface 102a of a second lead frame 102. In other words, the recess 102b may be formed on the inner surface 102a of the second lead frame 102 at portions corresponding to the solder fillets 51c and 51d formed on the edge of the semiconductor chips 21 to 23 adjacent to the side ends E2 and E4 of the first lead frame 101.

Exemplary Modification of the Fifth Embodiment

Figure 11:
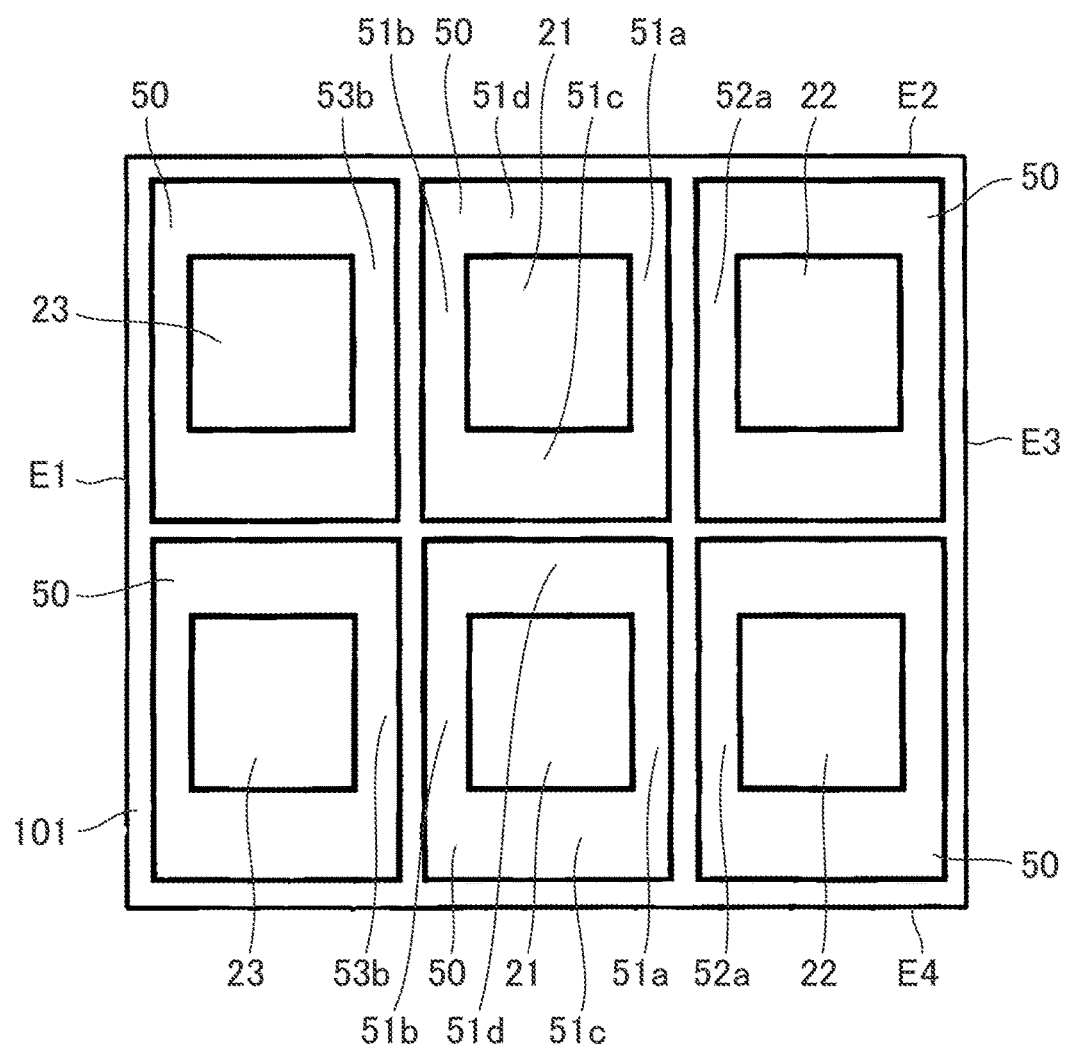
FIG. 11 is a diagram of an exemplary modification of the fifth embodiment.

FIG. 11 is a diagram of an exemplary modification of the fifth embodiment illustrated in FIG. 10.

In the exemplary modification illustrated in FIG. 11, the semiconductor chips 21 to 23 are arrayed in two rows.

The relationship between the lengths of the solder fillets 51a to 51d formed on the edges of the semiconductor chip 21 disposed in two rows is the same as the relationship described in FIG. 10. Thus, the exemplary modification of the fifth embodiment exerts the effect similar to the effect of the fifth embodiment.

The semiconductor chips 21 to 23 can also be formed in three rows or more. The number of the semiconductor chips 21 to 23 disposed in each row can be four or more.

Sixth Embodiment

Figure 12:
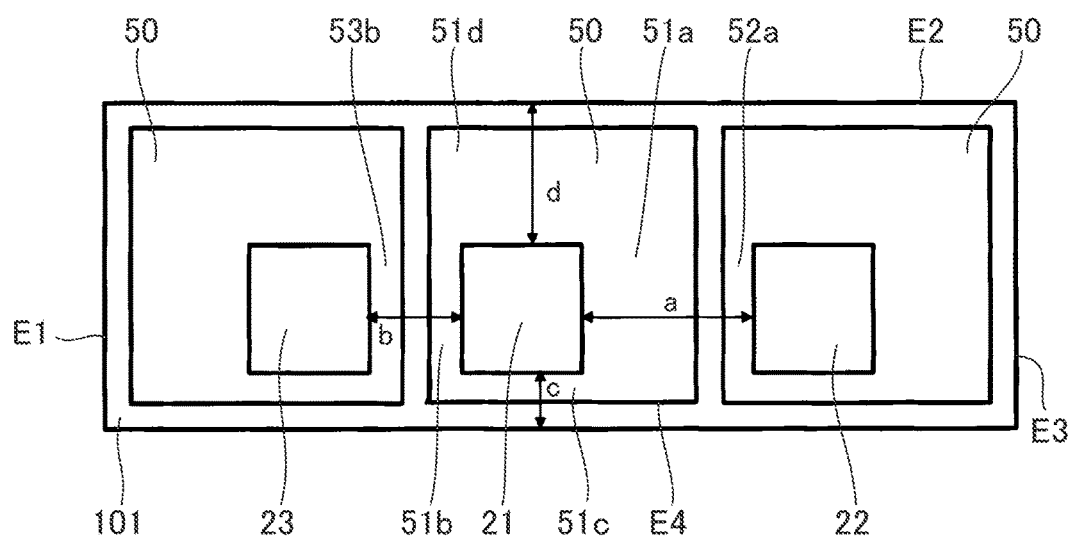
FIG. 12 is a schematic plan view of a sixth embodiment of the present invention showing the mounting structure of semiconductor chips provided on a power module.

FIG. 12 is a schematic plan view of a sixth embodiment of the present invention showing the mounting structure of semiconductor chips provided on a power module.

Similarly to the fifth embodiment, a power module 100 according to the sixth embodiment includes three semiconductor chips 21 to 23 linearly arrayed. However, the semiconductor chips 21 to 23 are disposed at positions off the center part of a first solder 50.

When the definitions of distances a to d in FIG. 12 are the same as those of the fifth embodiment, in the sixth embodiment, a distance b/2 and the distance c are shorter than the distances a and d. The distance b/2 is almost equal to the distance c. The distance a is almost equal to the distance d.

The lengths of solder fillets 51b and 53b of the semiconductor chips 21 and 23 formed on the edges adjacent to the other semiconductor chips 21 and 23 are almost equal to the length of a solder fillet 51c formed on the edge of the semiconductor chip 21 adjacent to a side end E4 of a first lead frame 101. The length of a solder fillet 51a formed on the edge of the semiconductor chip 21 adjacent to the semiconductor chip 22 is almost equal to the length of a solder fillet 51d formed on the edge of the semiconductor chip 21 adjacent to a side end E2 of the first lead frame 101. The lengths of the solder fillets 51b and 53b formed on the semiconductor chips 21 and 23 and the length of the solder fillet 51c formed on the semiconductor chip 21 are formed shorter than the lengths of the solder fillets 51a and 51d formed on the semiconductor chip 21.

In other words, the lengths of the solder fillets 51a and 51d formed on the semiconductor chip 21 are formed longer than the lengths of the solder fillets 51b and 53b formed on the semiconductor chips 21 and 23 and the length of the solder fillet 51c formed on the semiconductor chip 21. Note that, the length of the solder fillet 52a formed on the edge of the semiconductor chip 22 adjacent to the semiconductor chip 21 is almost equal to the lengths of the solder fillets 51b and 53b.

In the sixth embodiment, the lengths of the solder fillets 51a and 51d formed on the semiconductor chip 21 are formed longer than the lengths of the solder fillets 51b and 53b formed between the semiconductor chip 21 and the semiconductor chip 23. Thus, a short circuit between the semiconductor chips 21 and 23 caused by the solder fillets 51b and 53b can be prevented. The lengths of the solder fillets 51a and 51d formed on the semiconductor chip 21 are formed longer than the length of the solder fillet 51c formed on the semiconductor chip 21. Consequently, overflows of solder from the forming region of the solder fillet 51c formed on the semiconductor chip 21 to the side end E4 of the first lead frame 101 can be suppressed.

Note that, as described in the third and fourth embodiments (see FIGS. 8 and 9), in the sixth embodiment, a recess 102b or 102c may be formed on an inner surface 102a of a second lead frame 102. In other words, the recess 102c or 102b may be formed on the inner surface 102a of the second lead frame 102 at portions corresponding to the solder fillet 51a formed on the edge of the semiconductor chip 21 adjacent to the semiconductor chip 22 and the solder fillet 51d formed on the edges of the semiconductor chip 21 adjacent to the side ends E2 and E4 of the first lead frame 101. The recess 102b may be formed on the inner surface 102a of the second lead frame 102 at portions corresponding to the edges of the semiconductor chips 22 and 23 adjacent to the side ends E1 and E2, or E2 and E3 of the first lead frame 101.

First Exemplary Modification of the Sixth Embodiment

Figure 13:
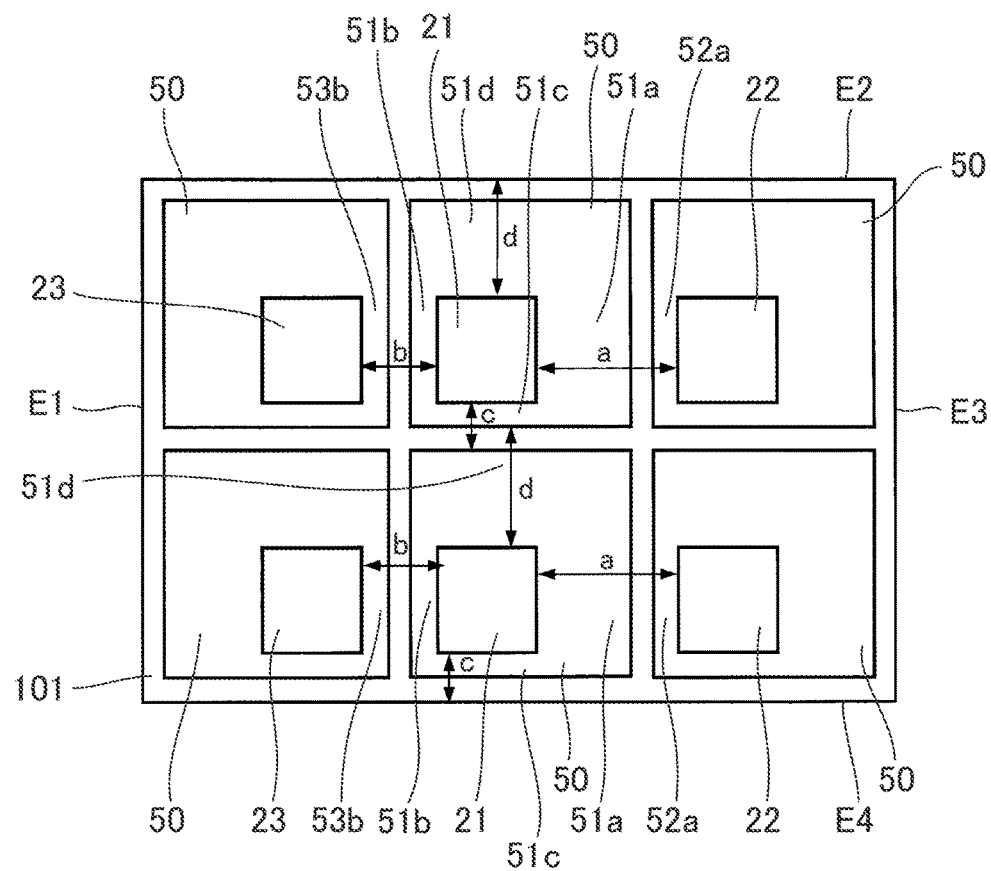
FIG. 13 is a diagram of a first exemplary modification of the sixth embodiment.

FIG. 13 is a diagram of a first exemplary modification of the sixth embodiment illustrated in FIG. 12.

In FIG. 13, the semiconductor chips 21 to 23 illustrated in FIG. 12 are arrayed in two rows. In the first exemplary modification of the sixth embodiment illustrated in FIG. 13, the relationship between the distances a to d between the semiconductor chips 21 to 23 adjacent to each other or the relationship between the distances a to d between the semiconductor chips 21 to 23 and the side ends E1 to E4 of the first lead frame 101 is the same as the sixth embodiment illustrated in FIG. 12 both in the first and second rows. The relationship between the lengths of the solder fillets (51a to 51d, 52a, 53b, and the like) formed on four edges of each of the semiconductor chips 21 to 23 is also the same as the sixth embodiment illustrated in FIG. 12 both in the first and second rows. Thus, the first exemplary modification also exerts the effect similar to the effect of the sixth embodiment illustrated in FIG. 12.

Note that, the semiconductor chips 21 to 23 can also be formed in three rows or more. The number of the semiconductor chips 21 to 23 disposed in each row can be four or more.

Second Exemplary Modification of the Sixth Embodiment

Figure 14:
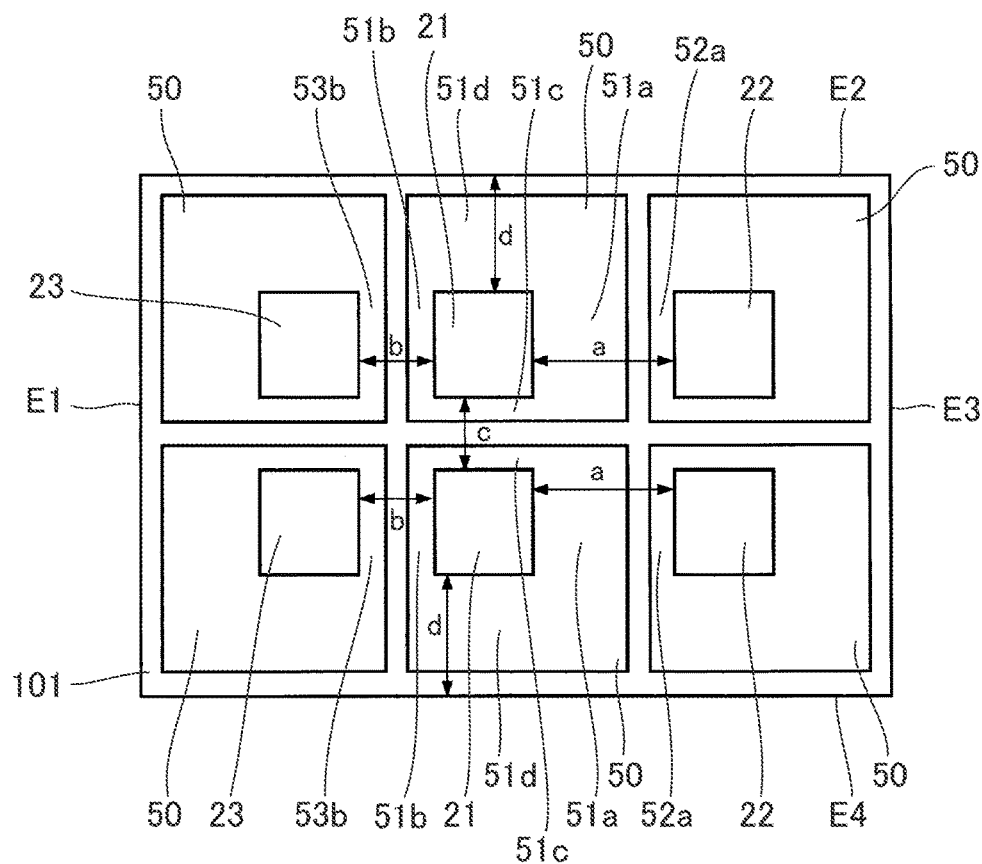
FIG. 14 is a diagram of a second exemplary modification of the sixth embodiment.

FIG. 14 is a diagram of a second exemplary modification of the sixth embodiment illustrated in FIG. 12.

Also in FIG. 14, the semiconductor chips 21 to 23 illustrated in FIG. 12 are arrayed in two rows. However, unlike the first exemplary modification illustrated in FIG. 13, the semiconductor chips 21 to 23 in the second row are disposed upside down with respect to the semiconductor chips 21 to 23 in the first row.

In the second exemplary modification of the sixth embodiment illustrated in FIG. 14, the relationship between the distances a to d between the semiconductor chips 21 to 23 adjacent to each other or the relationship between the distances a to d between the semiconductor chips 21 to 23 and the side ends E1 to E4 of the first lead frame 101 is the same as the sixth embodiment illustrated in FIG. 12 both in the first and second rows. The relationship between the lengths of the solder fillets (51a to 51d, 52a, 53b, and the like) formed on four edges of each of the semiconductor chips 21 to 23 is also the same as the sixth embodiment illustrated in FIG. 12 both in the first and second rows. Consequently, the second exemplary modification also exerts the effect similar to the effect of the sixth embodiment illustrated in FIG. 12.

Note that, in FIG. 14, a configuration may be possible in which the semiconductor chips 21 to 23 in three rows or more are provided by alternately adding the arrangement of the semiconductor chips 21 to 23 in the first and the second rows. The number of the semiconductor chips 21 to 23 disposed in each row can be four or more.

Seventh Embodiment

Figure 15:
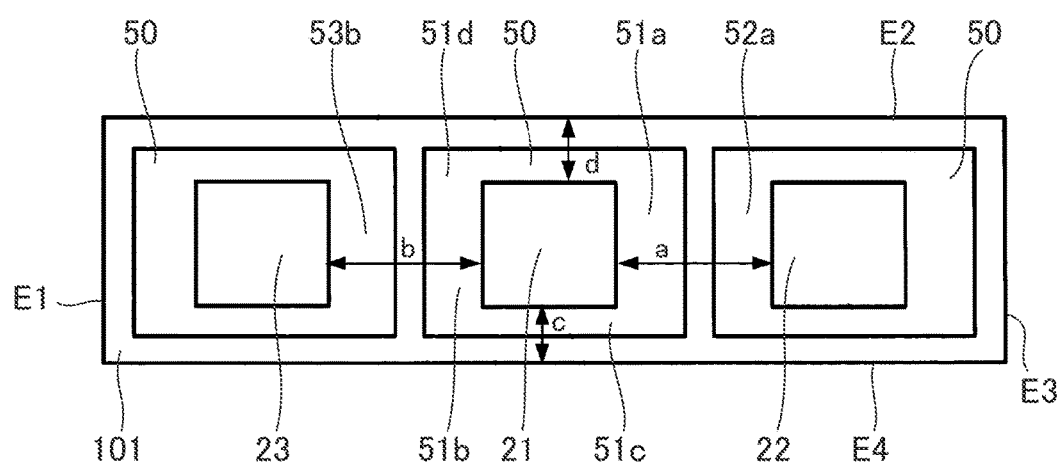
FIG. 15 is a schematic plan view of a seventh embodiment of the present invention showing the mounting structure of semiconductor chips provided on a power module.

FIG. 15 is a schematic plan view of a seventh embodiment of the present invention showing the mounting structure of semiconductor chips provided on a power module.

Similarly to the fifth embodiment, a power module 100 according to the seventh embodiment includes three semiconductor chips 21 to 23 linearly arrayed. The semiconductor chips 21 to 23 are disposed almost in the center part of the first solder 50 in the lateral direction and in the vertical direction. However, first solders 50 soldering the semiconductor chips 21 to 23 are in a rectangular shape in which the length in the lateral direction is longer than the length in the vertical direction.

In other words, when distances a to d are defined similarly to the fifth embodiment, the seventh embodiment has configurations below.

The distance a from the edge of the semiconductor chip 21 adjacent to the semiconductor chip 22 to the edge of the semiconductor chip 22 adjacent to the semiconductor chip 21 is almost equal to the distance b from the edge of the semiconductor chip 21 adjacent to the semiconductor chip 23 to the edge of the semiconductor chip 23 adjacent to the semiconductor chip 21. The distance d from the edge of the semiconductor chip 21 adjacent to a side end E2 of a first lead frame 101 to the side end E2 of the first lead frame 101 is almost equal to the distance c from the edge of the semiconductor chip 21 adjacent to a side end E4 of the first lead frame 101 to the side end E4 of the first lead frame 101. The distances c and d are formed shorter than distances a/2 and b/2.

The lengths of solder fillets 51a and 52a of the semiconductor chips 21 and 22 formed on the edges adjacent to the other semiconductor chips 21 and 22 are formed almost equal to the lengths of solder fillets 51b and 53b of the semiconductor chips 21 and 22 formed on the edges adjacent to the other semiconductor chips 21 and 23. The lengths of solder fillets 51c and 51d formed on the edges of the semiconductor chip 21 adjacent to the side ends E4 and E2 of the first lead frame 101 are formed almost equal to each other. The solder fillets 51a, 51b, 52a, and 53b are formed longer than the solder fillets 51c and 51d.

Thus, in the seventh embodiment, the solder of the solder fillets 51a, 51b, 52a, and 53b more easily overflows from the solder fillet forming regions than the solder of the solder fillets 51c and 51d does. Consequently, overflows of solder from the forming regions of the solder fillets 51c and 51d to the side ends E2 and E4 of the first lead frame 101 are suppressed.

Note that, similarly to the fourth embodiment (see FIG. 9), in the seventh embodiment, a recess 102c may be formed on an inner surface 102a of a second lead frame 102. In other words, the recess 102c maybe formed on the inner surface 102a of the second lead frame 102 at portions corresponding to the solder fillets 51a, 51b, 52a, and 53b of the semiconductor chips 21 to 23 formed on the edges adjacent to the other semiconductor chips 21 to 23.

Exemplary Modification of the Seventh Embodiment

Figure 16:
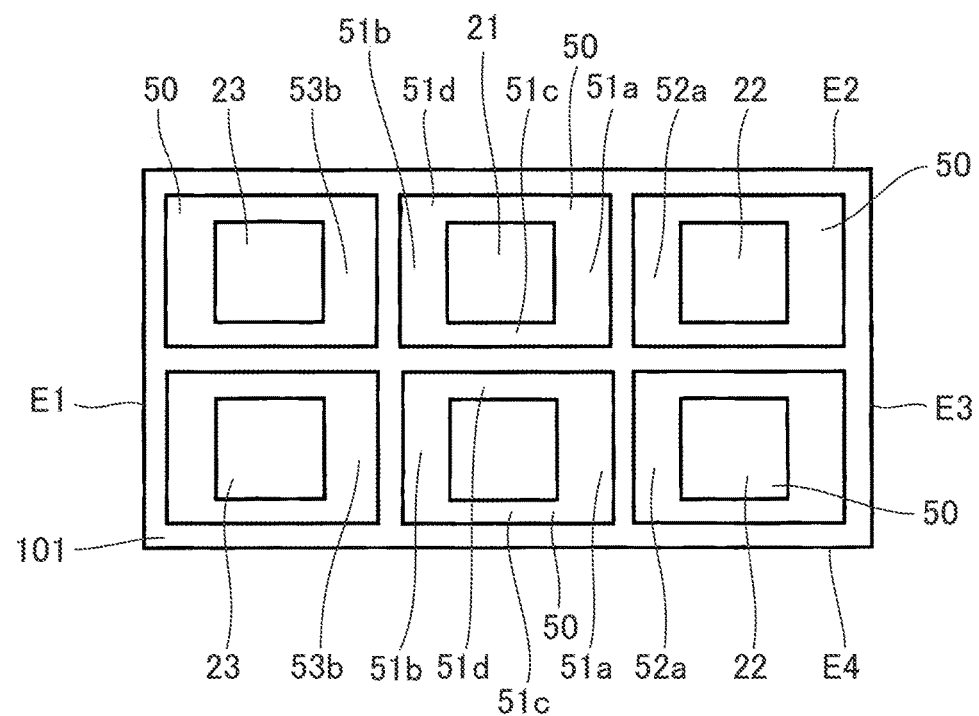
FIG. 16 is a diagram of an exemplary modification of the seventh embodiment.

FIG. 16 is a diagram of an exemplary modification of the seventh embodiment illustrated in FIG. 15.

In the exemplary modification illustrated in FIG. 16, the semiconductor chips 21 to 23 are arrayed in two rows.

The relationship between the lengths of the solder fillets 51a to 51d formed on the edges of the semiconductor chip 21 disposed in two rows is the same as the relationship described in FIG. 15. Thus, the exemplary modification of the seventh embodiment exerts the effect similar to the effect of the seventh embodiment.

The semiconductor chips 21 to 23 can also be formed in three rows or more.

The number of the semiconductor chips 21 to 23 disposed in each row can be four or more.

Confirmation of the Effects

In the following, specific examples of the effects of the present invention are shown using examples.

Example 1

FIG. 17 is a diagram of a first effect of the present invention showing the frequency of occurrence of short circuits between semiconductor chips according to Example 1 of the present invention.

Example 1 has a solder structure of a first lead frame 101, a second lead frame 102, and semiconductor chips 11 to 14 shown in FIGS. 3 and 4 as the first embodiment. In detail, the first and the second lead frames 101 and 102 were formed of copper plates. Four projections 103 were formed on the second lead frame 102, and the four semiconductor chips 11 to 14 were mounted corresponding to the projections 103. The semiconductor chips 11 to 14 have a rectangular parallelepiped shape of a 10 mm square in size. Distances (a, b, and the like) between the semiconductor chips 11 to 14 adjacent to each other were set to 1.0 mm. Distances (c, d, and the like) from the semiconductor chips 11 to 14 to side ends E1 to E4 of the first lead frame 101 were set to 2.0 mm.

The lengths of solder fillets (51a, 51b, 52a, 53b, and the like) of the semiconductor chips 11 to 14 formed on the edges adjacent to the other semiconductor chips 11 to 14 were set to 0.3 mm. The lengths of solder fillets (51c, 51d, and the like) formed on the edges of the semiconductor chips 11 to 14 adjacent to the side ends E1 to E4 of the first lead frame 101 were set to 1.0 mm. For solder 50, a sheet of Sn3Ag0.5Cu solder was used. A vacuum reflow device was used for reflow, and connected using a temperature profile with a peak at a temperature of 250° C.

As Comparative Example 1, a solder structure, shown below, of a first lead frame 101, a second lead frame 102, and semiconductor chips 11 to 14 was prepared.

The lengths of solder fillets (51a, 51b, 52a, 53b, and the like) of the semiconductor chips 11 to 14 formed on the edges adjacent to the other semiconductor chips 11 to 14 were set to 0.3 mm. The lengths of solder fillets (51c, 51d, and the like) formed on the edges of the semiconductor chips 11 to 14 adjacent to side ends E1 to E4 of the first lead frame 101 were set to 0.3 mm. In other words, the lengths of the solder fillets formed on four edges of each of the semiconductor chips 11 to 14 were all set to 0.3 mm.

The configurations other than the configurations above are all similar to the configurations of Example 1.

Example 1 and Comparative Example 1 were prepared for 20 devices each. On Example 1 and Comparative Example 1, the number of occurrences of short circuits between the semiconductor chips 11 to 14 and the number of occurrences of overflows of solder from the solder fillet forming regions to the side ends of the first lead frame 101 in the semiconductor chips 11 to 14 were checked. The result is shown in FIG. 17.

In Comparative Example 1, i.e., in the mounting structure in which the lengths of the solder fillets formed on four edges of each of the semiconductor chips 11 to 14 were all formed in 0.3 mm, a short circuit occurred between the semiconductor chips 11 to 14 in seven out of 20 devices.

On the other hand, in Example 1, i.e., in the mounting structure in which the lengths of the solder fillets (51a, 51b, 52a, 53b, and the like) of the semiconductor chips 11 to 14 formed on the edges adjacent to the other semiconductor chips 11 to 14 were set to 0.3 mm and the lengths of the solder fillets (51c, 51d, and the like) formed on the edges of the semiconductor chips 11 to 14 adjacent to the side ends of the first lead frame 101 were set to 1.0 mm, no short circuit occurred between the semiconductor chips 11 to 14 in zero out of 20 devices.

Note that, both in Example 1 and Comparative Example 1, the number of occurrences of overflows of solder from the solder fillets formed on the semiconductor chips 11 to 14 to the side ends E1 to E4 of the first lead frame 101 was zero out of 20 devices.

From the description above, according to Example 1 of the present invention, it was confirmed that overflows of solder from the forming regions of the solder fillets of the semiconductor chips 11 to 14 formed on the edges adjacent to the other semiconductor chips 11 to 14 were suppressed and a short circuit between the semiconductor chips 11 to 14 could be prevented.

Example 2

FIG. 18 is a diagram of a second effect of the present invention showing the frequency of occurrence of short circuits between semiconductor chips according to Example 2 of the present invention.

Example 2 has a solder structure of first and second lead frames 101 and 102, and semiconductor chips 11 to 14 of the second embodiment illustrated in FIGS. 6 and 7. In detail, the first and second lead frames 101 and 102 were formed of copper plates. Four projections 103 were formed on the second lead frame 102, and the four semiconductor chips 11 to 14 were mounted corresponding to the projections 103. The semiconductor chips 11 to 14 have a rectangular parallelepiped shape of a 10 mm square in size. Distances (a, b, and the like) between the semiconductor chips 11 to 14 adjacent to each other were set to 3.0 mm. Distances (c, d, and the like) from the semiconductor chips 11 to 14 to side ends E1 to E4 of the first lead frame 101 were set to 1.0 mm.

The lengths of solder fillets (51a, 51b, 52a, 53b, and the like) of the semiconductor chips 11 to 14 formed on the edges adjacent to the other semiconductor chips 11 to 14 were set to 1.0 mm. The lengths of solder fillets (51c, 51d, and the like) formed on the edges of the semiconductor chips 11 to 14 adjacent to the side ends E1 to E4 of the first lead frame 101 were set to 0.3 mm. For solder 50, a sheet of Sn3Ag0.5Cu solder was used. A vacuum reflow device was used for reflow, and connected using a temperature profile with a peak at a temperature of 250° C.

As Comparative Example 2, a solder structure, shown below, of a first lead frame 101, a second lead frame 102, and semiconductor chips 11 to 14 was prepared.

The lengths of solder fillets (51a, 51b, 52a, 53b, and the like) of the semiconductor chips 11 to 14 formed on the edges adjacent to the other semiconductor chips 11 to 14 were set to 0.3 mm. The lengths of solder fillets (51c, 51d b, and the like) formed on the edges of the semiconductor chips 11 to 14 adjacent to side ends E1 to E4 of the first lead frame 101 were set to 0.3 mm. In other words, the lengths of the solder fillets formed on four edges of each of the semiconductor chips 11 to 14 were all set to 0.3 mm.

The configurations other than the configurations above are all similar to the configurations of Example 2.

Example 2 and Comparative Example 2 were prepared for 20 devices each. On Example 2 and Comparative Example 2, the number of occurrences of short circuits between the semiconductor chips 11 to 14 and the number of occurrences of overflows of solder from the solder fillet forming regions to the side ends of the first lead frame 101 in the semiconductor chips 11 to 14 were checked. The result is shown in FIG. 18.

In Comparative Example 2, i.e., in the mounting structure in which the lengths of the solder fillets formed on four edges of each of the semiconductor chips 11 to 14 were set to 0.3 mm, solder overflowed from the forming regions of the solder fillets formed on the semiconductor chips 11 to 14 to the side ends E1 to E4 of the first lead frame 101 in 11 out of 20 devices.

On the other hand, in Example 2, i.e., in the mounting structure in which the lengths of the solder fillets of the semiconductor chips 11 to 14 formed on the edges adjacent to the other semiconductor chips 11 to 14 were set to 1.0 mm and the lengths of the solder fillets formed on the edges of the semiconductor chips 11 to 14 adjacent to the side ends E1 to E4 of the first lead frame 101 were set to 0.3 mm, no solder overflowed from the forming regions of the solder fillets formed on the semiconductor chips 11 to 14 to the side ends E1 to E4 of the first lead frame 101 in zero out of 20 devices.

Note that, both in Example 2 and Comparative Example 2, the number of occurrences of faults, which are short circuits between the semiconductor chips 11 to 14, was zero.

From the description above, according to Example 2 of the present invention, overflows of solder from the forming regions of the solder fillets formed on the edges of the semiconductor chips 11 to 14 adjacent to the side ends E1 to E4 of the first lead frame 101 to the side ends E1 to E4 of the first lead frame 101 can be suppressed.

Note that, in Example 1, an example was shown in which the lengths of the solder fillets (51a, 51b, 52a, 53b, and the like) of the semiconductor chips 11 to 14 formed on the edges adjacent to the other semiconductor chips 11 to 14 were set to 0.3 mm and the lengths of the solder fillets (51c, 51d, and the like) formed on the edges of the semiconductor chips 11 to 14 adjacent to the side ends E1 to E4 of the first lead frame 101 were set to 1.0 mm. However, the lengths of the solder fillets are examples. The lengths of the solder fillets (51a, 51b, 52a, 53b, and the like) of the semiconductor chips 11 to 14 formed on the edges adjacent to the other semiconductor chips 11 to 14 may be shorter than 0.3 mm or longer than 0.3 mm. The lengths of the solder fillets (51a, 51b, and the like) formed on two opposite edges of the semiconductor chips 11 to 14 adjacent to each other may be different from each other. Similarly, the lengths of the solder fillets (51c, 51d, and the like) formed on the edges of the semiconductor chips 11 to 14 adjacent to the side ends E1 to E4 of the first lead frame 101 may be shorter than 1.0 mm or longer than 1.0 mm. The lengths of the solder fillets (51c, 51, and the like) formed on two edges of the semiconductor chips 11 to 14 adjacent to the side ends E1 to E4 of the first lead frame 101 may be different from each other.

In Example 2, an example was shown in which the lengths of the solder fillets (51a, 51b, 52a, 53b, and the like) of the semiconductor chips 11 to 14 formed on the edges adjacent to the other semiconductor chips 11 to 14 were set to 1.0 mm and the lengths of the solder fillets (51c, 51d, and the like) formed on the edges of the semiconductor chips 11 to 14 adjacent to the side ends E1 to E4 of the first lead frame 101 were set to 0.3 mm. However, the lengths of the solder fillets are examples. The lengths of the solder fillets (51a, 51b, 52a, 53b, and the like) of the semiconductor chips 11 to 14 formed on the edges adjacent to the other semiconductor chips 11 to 14 may be shorter than 1.0 mm or longer than 1.0 mm. The lengths of the solder fillets (51a, 51b, and the like) formed on edges of the semiconductor chips 11 to 14 adjacent to edges of the other semiconductor chips 11 to 14 may be different from each other. Similarly, the lengths of the solder fillets (51c, 51d, and the like) formed on the edges of the semiconductor chips 11 to 14 adjacent to the side ends E1 to E4 of the first lead frame 101 may be shorter than 0.3 mm or longer than 0.3 mm. The lengths of the solder fillets (51c, 51, and the like) formed on two edges of the semiconductor chips 11 to 14 adjacent to the side ends of the first lead frame 101 may be different from each other.

As a method for reliably adjusting the lengths of the solder fillets formed on the edges of the semiconductor chips 11 to 14 and 21 to 23, a solder wetting prevention structure for preventing solder wetting may be formed around regions in which solder fillets are formed. The solder wetting prevention structure can be formed, for example, by coating a solder resist, by dimpling, by oxidation treatment using a laser and the like, or by chemical roughening and the like.

In the foregoing embodiments, examples of structures were described in which the semiconductor chips 11 to 14 and 21 to 23 were soldered to the first and the second lead frames 101 and 102 with the solders 50 and 60. However, the embodiments are applicable to structures with no second lead frame 102.

In the foregoing embodiments, examples of structures were described in which the projections 103 were provided on the second lead frame 102 to which the semiconductor chips 11 to 14 and 21 to 23 were soldered with the solder 60. However, structures may be provided in which no projections 103 are formed on the second lead frame 102.

In the foregoing embodiments, examples of structures were described in which the semiconductor chips 11 to 14 and 21 to 23 were soldered to the first and the second lead frames 101 and 102 with the solders 50 and 60. However, instead of the first and the second lead frames 101 and 102, cast products such as aluminum die cast products, and sintered compacts such as ceramic, can also be used.

The first to the seventh embodiments may be selectively combined.

Other than the configurations above, the present invention is applicable in various modifications and alternations within the gist of the present invention. In short, a power module only has to have a configuration in which among a half of a distance from a first edge of a first semiconductor chip to one edge of a second semiconductor chip adjacent to the first edge of the first semiconductor chip, a half of a distance from a second edge of the first semiconductor chip to one edge of a third semiconductor chip adjacent to the second edge of the first semiconductor chip, and a distance from at least one of a third edge or a fourth edge of the first semiconductor chip to a side end of a base plate, the length of a solder fillet formed on the edge of the first semiconductor chip at the shortest distance is the shortest length.

This application is based on and claims the benefit of priority from earlier Japanese Patent Application No. 2015-22257 (filed in Japan on Feb. 6, 2015), the content of the disclosure of which is incorporated herein by reference.

LIST OF REFERENCE SIGNS 11 to 14 semiconductor chip
21 to 23 semiconductor chip
50 first solder
51a, 51b, 51c, 51d solder fillet
52a, 52c solder fillet
53a, 53b solder fillet
60 second solder
61 solder fillet
100 power module
101 first lead frame (base plate)
102 second lead frame
102a inner surface
102b, 102c recess
103 projection
111 lead
201 module case
304B flange
305 fin
307 heat dissipation base
350 primary sealing material
351 secondary sealing material
a to d distance
E1, E2, E3, E4 side end

The invention claimed is:

1. A power module comprising:
a base plate;
a first semiconductor chip having four edges;
a second semiconductor chip having four edges, one of the four edges disposed adjacent to a first edge of the first semiconductor chip, the second semiconductor chip soldered to the base plate; and
a third semiconductor chip having four edges, one of the four edges disposed adjacent to a second edge of the first semiconductor chip, the third semiconductor chip soldered to the base plate,
wherein at least one of a third edge or a fourth edge of the first semiconductor chip is disposed adjacent to a side end of the base plate, and
among a half of a distance from the first edge of the first semiconductor chip to the one edge of the second semiconductor chip, a half of a distance from the second edge of the first semiconductor chip to the one edge of the third semiconductor chip, and a distance from the third edge or the fourth edge of the first semiconductor chip disposed adjacent to the side end of the base plate to the side end of the base plate, a length of a solder fillet formed on the edge of the first semiconductor chip at the shortest distance is formed in the shortest length.

2. The power module according to claim 1,
wherein a half of the distance from the first edge of the first semiconductor chip to the one edge of the second semiconductor chip and a half of the distance from the second edge of the first semiconductor chip to the one edge of the third semiconductor chip are shorter than the distance from the third edge or the fourth edge of the first semiconductor chip disposed adjacent to the side end of the base plate to the side end of the base plate, and
lengths of the solder fillets formed on the first edge and the second edge of the first semiconductor chip are formed shorter than a length of the solder fillet formed on the third edge or the fourth edge of the first semiconductor chip adjacent to the side end of the base plate.

3. The power module according to claim 2,
wherein the first edge and the second edge of the first semiconductor chip are edges adjacent to each other, the third edge and the fourth edge of the first semiconductor chip are disposed adjacent to a first side end and a second side end of the base plate adjacent to each other, and the lengths of the solder fillets formed on the first edge and the second edge of the first semiconductor chip are formed shorter than the lengths of the solder fillets formed on the third edge and the fourth edge of the first semiconductor chip.

4. The power module according to claim 2,
wherein the first edge and the second edge of the first semiconductor chip are a pair of edges opposite to each other, at least one of the third edge or the fourth edge of the first semiconductor chip is disposed adjacent to the side end of the base plate, and the lengths of the solder fillets formed on the first edge and the second edge of the first semiconductor chip are formed shorter than the length of the solder fillet formed on the third edge or the fourth edge of the first semiconductor chip disposed adjacent to the side end of the base plate.

5. The power module according to claim 4,
wherein the third edge and the fourth edge of the first semiconductor chip are respectively disposed adjacent to the side ends of the base plate, and
the lengths of the solder fillets formed on the first edge and the second edge of the first semiconductor chip are formed shorter than the lengths of the solder fillets formed on the third edge and the fourth edge of the first semiconductor chip.

6. The power module according to claim 4, further comprising:
a fourth semiconductor chip disposed adjacent to the third edge of the first semiconductor chip,
wherein the fourth edge of the first semiconductor chip is disposed adjacent to the side end of the base plate, and
the lengths of the solder fillets formed on the first edge and the second edge of the first semiconductor chip are formed shorter than the lengths of the solder fillets formed on the third edge and the fourth edge of the first semiconductor chip.

7. The power module according to claim 1,
wherein the first edge and the second edge of the first semiconductor chip are a pair of edges opposite to each other,
the third edge and the fourth edge of the first semiconductor chip are another pair of edges opposite to each other,
at least one of the third edge and the fourth edge of the first semiconductor chip is disposed adjacent to the side end of the base plate, and
the length of the solder fillet formed on the first edge of the first semiconductor chip is formed shorter than the length of the solder fillet formed on the second edge of the first semiconductor chip and the length of the solder fillet formed on the third edge or the fourth edge disposed adjacent to the side end of the base plate.

8. The power module according to claim 1,
wherein the first edge and the second edge of the first semiconductor chip are a pair of edges opposite to each other,
the third edge and the fourth edge of the first semiconductor chip are another pair of edges opposite to each other,
at least one of the third edge or the fourth edge of the first semiconductor chip is disposed adjacent to the side end of the base plate,
the distance from the third edge or the fourth edge of the first semiconductor chip disposed adjacent to the side end of the base plate to the side end of the base plate is shorter than a half of the distance from the first edge of the first semiconductor chip to the one edge of the second semiconductor chip and a half of the distance from the second edge of the first semiconductor chip to the one edge of the third semiconductor chip, and
the length of the solder fillet of the first semiconductor chip formed on the third edge or the fourth edge of the first semiconductor chip disposed adjacent to the side end of the base plate is formed shorter than the lengths of the solder fillets formed on the first edge and the second edge of the first semiconductor chip.

9. The power module according to claim 8,
wherein the third edge and the fourth edge of the first semiconductor chip are disposed adjacent to the side ends of the base plate, and
the lengths of the solder fillets formed on the third edge and fourth edge of the first semiconductor chip are formed shorter than the lengths of the solder fillets formed on the first edge and the second edge of the first semiconductor chip.

10. The power module according to claim 9, further comprising:
a fourth semiconductor chip disposed adjacent to the third edge of the first semiconductor chip,
wherein the fourth edge of the first semiconductor chip is disposed adjacent to the side end of the base plate, and
the lengths of the solder fillets formed on the third edge and the fourth edge of the first semiconductor chip are formed shorter than the lengths of the solder fillets formed on the first edge and the second edge of the first semiconductor chip.

11. The power module according to claim 1,
wherein in the solder fillets formed on the four edges of the first semiconductor chip, lengths of the solder fillets formed on two edges of the first semiconductor chip are formed shorter than lengths of the solder fillets formed on other two edges of the first semiconductor chip.

12. The power module according to claim 11, further comprising:
another base plate disposed opposite to the base plate,
wherein in the first, second, and third semiconductor chips, one face is soldered to the base plate and another face is soldered to the another base plate, and
a recess is formed on a face of the another base plate, the face is opposite to the base plate, and the recess is formed opposite to at least the longest one of the solder fillets formed on the edges of the first semiconductor chip.

13. A power module comprising:
a first base plate;
a second base plate disposed opposite to the first base plate, the second base plate having a projection formed on a face opposite to the first base plate; and
a semiconductor chip having a first face and a second face opposite to the first face, the semiconductor chip having four edges, in which the first face is soldered to the first base plate with a first solder and the second face is soldered to the projection of the second base plate with a second solder,
wherein in solder fillets made of the first solder formed on the four respective edges of the first face of the semiconductor chip, a length of the solder fillet formed on at least one edge of the semiconductor chip is different from lengths of the solder fillets formed on any of the other three edges, and
lengths of solder fillets made of the second solder formed on the four respective edges of the second face of the semiconductor chip are formed shorter than the lengths of the solder fillets made of the first solder formed on the four respective edges of the first face of the semiconductor chip.

14. The power module according to claim 13,
wherein in the solder fillets made of the first solder formed on the four respective edges of the first face of the semiconductor chip, lengths of the solder fillets formed on two edges of the first face of the semiconductor chip are respectively formed shorter than lengths of the solder fillets formed on other two edges of the first face of the semiconductor chip.

* * * * *